(12) United States Patent
Mizutani et al.

(10) Patent No.: US 8,089,615 B2
(45) Date of Patent: Jan. 3, 2012

(54) SUBSTRATE HOLDING APPARATUS, EXPOSURE APPARATUS, EXPOSING METHOD, AND DEVICE FABRICATING METHOD

(75) Inventors: Takeyuki Mizutani, Kumagaya (JP); Yuichi Shibazaki, Kumagaya (JP); Makoto Shibuta, Kumagaya (JP)

(73) Assignee: Nikon Corporation, Tokyo (JP)

( * ) Notice: Subject to any disclaimer, the term of this patent is extended or adjusted under 35 U.S.C. 154(b) by 682 days.

(21) Appl. No.: 12/155,514

(22) Filed: Jun. 5, 2008

(65) Prior Publication Data

US 2008/0239275 A1 Oct. 2, 2008

Related U.S. Application Data

(63) Continuation of application No. PCT/JP2006/324552, filed on Dec. 8, 2006.

(30) Foreign Application Priority Data

Dec. 8, 2005 (JP) .................................. 2005-354463

(51) Int. Cl.
*B23B 5/34* (2006.01)
*G03B 27/32* (2006.01)
*G03B 27/42* (2006.01)
*G03B 27/52* (2006.01)
*G03B 27/58* (2006.01)
*G03B 27/60* (2006.01)

(52) U.S. Cl. ................. 355/73; 355/30; 355/53; 355/72; 355/77; 279/3

(58) Field of Classification Search ............... 250/492.2; 279/3; 310/12.01, 12.05–12.06; 318/649; 355/30, 53, 72–73, 77
See application file for complete search history.

(56) References Cited

U.S. PATENT DOCUMENTS 5,850,280 A 12/1998 Ohtomo et al.
(Continued)

FOREIGN PATENT DOCUMENTS

EP 1 641 028 A1 3/2006
(Continued)

OTHER PUBLICATIONS

Search report mailed on May 9, 2011 in corresponding European Application No. 06834307.8.
(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

A substrate holding apparatus includes a base part and a support part that is formed on the base part and supports a rear surface of the substrate. A first circumferential wall is formed on the base part, has a first upper surface that opposes the rear surface of the substrate, which is supported by the support part, and surrounds a first space that is between the substrate, which is supported by the support and the base part. A second circumferential wall is formed on the base part, has a second upper surface that opposes the rear surface of the substrate, which is supported by the support part, with a gap interposed therebetween, and surrounds the first circumferential wall. A third circumferential wall is formed on the base part, has a third upper surface that opposes the rear surface of the substrate, which is supported by the support part; and surrounds the support part and the second circumferential wall. A fluid flow port is capable of supplying gas to a second space that is between the first circumferential wall and the second circumferential wall. A first suction port suctions fluid from a third space that is between the second circumferential wall and the third circumferential wall.

32 Claims, 13 Drawing Sheets

U.S. PATENT DOCUMENTS

| | | | |
|---|---|---|---|
| 5,969,441 | A | 10/1999 | Loopstra et al. |
| 6,208,407 | B1 | 3/2001 | Loopstra |
| 6,262,796 | B1 | 7/2001 | Loopstra et al. |
| 6,341,007 | B1 | 1/2002 | Nishi et al. |
| 6,400,441 | B1 | 6/2002 | Nishi et al. |
| 6,549,269 | B1 | 4/2003 | Nishi et al. |
| 6,590,634 | B1 | 7/2003 | Nishi et al. |
| 6,611,316 | B2 | 8/2003 | Sewell |
| 6,721,034 | B1 | 4/2004 | Horikawa |
| 6,778,257 | B2 | 8/2004 | Bleeker et al. |
| 6,897,963 | B1 | 5/2005 | Taniguchi et al. |
| 7,199,858 | B2 | 4/2007 | Lof et al. |
| 2005/0122505 | A1 | 6/2005 | Miyajima |
| 2005/0219488 | A1 | 10/2005 | Nei et al. |
| 2005/0219499 | A1 | 10/2005 | Maria Zaal et al. |
| 2006/0139614 | A1* | 6/2006 | Owa et al. ............ 355/72 |
| 2007/0146665 | A1* | 6/2007 | Ottens et al. .......... 355/53 |
| 2007/0177125 | A1 | 8/2007 | Shibazaki |
| 2007/0269294 | A1 | 11/2007 | Nagasaka et al. |
| 2008/0043210 | A1 | 2/2008 | Shibuta |
| 2008/0165330 | A1* | 7/2008 | Mizutani ............... 355/30 |
| 2008/0202555 | A1* | 8/2008 | Shibazaki .............. 134/6 |
| 2009/0135382 | A1* | 5/2009 | Kida .................... 355/30 |
| 2010/0195068 | A1* | 8/2010 | Shibazaki ............. 355/30 |

FOREIGN PATENT DOCUMENTS

| | | |
|---|---|---|
| JP | A-08-130179 | 5/1996 |
| JP | A-10-163099 | 6/1998 |
| JP | A-10-214783 | 8/1998 |
| JP | A-11-135400 | 5/1999 |
| JP | A-2000-505958 | 5/2000 |
| JP | A-2000-164504 | 6/2000 |
| JP | A-2004-519850 | 7/2004 |
| JP | A-2004-289127 | 10/2004 |
| JP | A-2005-175016 | 6/2005 |
| JP | A-2005-310933 | 11/2005 |
| WO | WO 99/49504 | 9/1999 |
| WO | WO 01/35168 A1 | 5/2001 |
| WO | WO 02/069049 A2 | 9/2002 |
| WO | WO 2004/019128 A2 | 3/2004 |
| WO | WO 2004/093160 A2 | 10/2004 |
| WO | WO 2004/112108 A1 | 12/2004 |
| WO | WO 2005/059617 A2 | 6/2005 |
| WO | WO 2005/059618 A2 | 6/2005 |
| WO | WO 2006077859 A1 * | 7/2006 |

OTHER PUBLICATIONS

International Search Report mailed on Mar. 6, 2007 in corresponding PCT Application No. PCT/JP2006/324552. (with English language translation).

Written Opinion mailed on Mar. 6, 2007 in corresponding PCT Application No. PCT/JP2006/324552. (with English language translation).

* cited by examiner

SUBSTRATE HOLDING APPARATUS, EXPOSURE APPARATUS, EXPOSING METHOD, AND DEVICE FABRICATING METHOD

CROSS-REFERENCE TO RELATED APPLICATION

This application is a Continuation application of International Application No. PCT/JP2006/324552, filed Dec. 8, 2006, which claims priority to Japanese Patent Application No. 2065-354463, filed Dec. 8, 2005.

BACKGROUND

1. Field of the Invention

The present invention relates to: a substrate holding apparatus that holds a substrate; an exposure apparatus and an exposing method a expose the substrate through a liquid, and a device fabricating method.

2. Description of Related Art

Among exposure apparatuses that are used in photolithography, a liquid immersion type exposure apparatus is known that exposes a substrate through a liquid, as disclosed in PCT International Publication WO99/49504, and Japanese Patent Application Publication No. 2004-289127 A.

In an immersion exposure apparatus, there is a possibility that various problems will occur if the liquid leaks into a space on the rear surface side of the substrate through, for example, a gap between the substrate and a substrate stage, and then adheres to the rear surface of the substrate. If the liquid adheres to, for example, a prescribed area of the rear surface of the substrate, then here is a possibility that the substrate cannot be held satisfactorily by a holder of the substrate stage. Also, there is a possibility that the extent of the damage may widen, e.g., when a transport apparatus is used to unload the substrate from the holder, the liquid may adhere to the transport apparatus, which contacts the rear surface of the substrate, or may be dispersed in the transport pathway.

A purpose of some aspects of the present invention is to provide: a substrate holding apparatus that can prevent a liquid from adhering to a prescribed area of a rear surface of a substrate; an exposure apparatus and an exposing method that expose the substrate through the liquid; and a device fabricating method that uses the exposure apparatus and the exposing method.

SUMMARY

A first aspect of the invention provides a substrate holding apparatus that holds a substrate, which is irradiated by exposure light, and comprises: a base part; a support part that is formed on the base part and supports a rear surface of the substrate; a first circumferential wall that: is formed on the base part; has a first upper surface that opposes the rear surface of the substrate, which is supported by the support part; and surrounds a first space that is between the substrate, which is supported by the support park and the base part; a second circumferential wall that: is formed on the base part; has a second upper surface that opposes the rear surface of the substrate, which is supported by the support part, with a gap interposed therebetween; and surrounds the first circumferential wall; a third circumferential wall that: is formed on the base part; has a third upper surface that opposes the rear surface of the substrate, which is supported by the support part; and surrounds the support part and the second circumferential wall; a fluid flow port that is capable of supplying gas to a second space that is between the first circumferential wall and the second circumferential wall; and a first suction port that suctions fluid from a third space that is between the second circumferential wall and the third circumferential wall.

According to the first aspect of the invention, it is possible to prevent a liquid from adhering to a prescribed area of the rear surface of the substrate.

A second aspect of the invention provides an exposure apparatus that comprises: a substrate holding apparatus according to the abovementioned aspect; wherein, a substrate, which is held by the substrate holding apparatus, is exposed trough a liquid.

According to the second aspect of the invention, it is possible to prevent the liquid from adhering to the prescribed area of the rear surface of the substrate, and thereby to expose the substrate satisfactorily.

A third aspect of the invention provides a device fabricating method, comprising the steps of: exposing a substrate using an exposure apparatus according to the abovementioned aspects; and developing the exposed substrate.

According to the third aspect of the invention, it is possible to fabricate a device using an exposure apparatus that can expose a substrate satisfactorily.

A fourth aspect of the invention provides an exposing method that performs an immersion exposure and comprises the steps of: holding a substrate with a substrate holding apparatus; and exposing the substrate, which is held by the substrate holding apparatus; wherein, the substrate holding apparatus comprises: a base part; a support part that is formed on the base part and supports a rear surface of the substrate; a first circumferential wall that: is formed on the base part has a first upper surface that opposes the rear surface of the substrate, which is supported by the support part; and surrounds a first space that is between the substrate, which is supported by the support part, and the base part; a second circumferential wall that: is formed on the base part has a second upper surface that opposes the rear surface of the substrate, which is supported by the support part, with a gap interposed therebetween; and surrounds the first circumferential wall; a third circumferential wall that: is formed on the base port; has a third upper surface that opposes the rear surface of the substrate, which is supported by the support part; and surrounds the support part and the second circumferential wall; a fluid flow port that is capable of supplying gas to a second space that is between the first circumferential wall and the second circumferential wall; and a first suction port that suctions fluid from a third space that is between the second circumferential wall and the third circumferential wall.

According to the fourth aspect of the invention, it is possible to prevent the liquid from adhering to the prescribed area of the rear surface of the substrate, and thereby to expose the substrate satisfactorily through the liquid.

A fifth aspect of the invention provides a device fabricating method that comprises the steps of: exposing the substrate using an exposing method according to the abovementioned aspects; and developing the exposed substrate.

According to the fifth aspect of the invention, it is possible to fabricate a device using an exposing method that can expose a substrate satisfactorily.

According to some aspects of the present invention, it is possible to prevent a liquid from adhering to a prescribed area of a rear surface of a substrate, and thereby to expose the substrate satisfactorily.

DESCRIPTION OF EMBODIMENTS

The following explains the embodiments of the present invention referencing the drawings, but the present invention is not limited thereto. Furthermore, the following explanation defines an XYZ orthogonal coordinate system, and the positional relationships among members are explained referencing this system. Furthermore, prescribed directions within the horizontal plane are the X axial directions, directions that are orthogonal to the X axial directions in the horizontal plane are the Y axial directions, and directions that are orthogonal to the X axial directions and the Y axial directions (i.e., the vertical directions) are the Z axial directions. In addition, the rotational directions around the X, Y, and Z axes (i.e., the inclined directions) are the θX, θY, and θZ directions, respectively.

Figure 1:
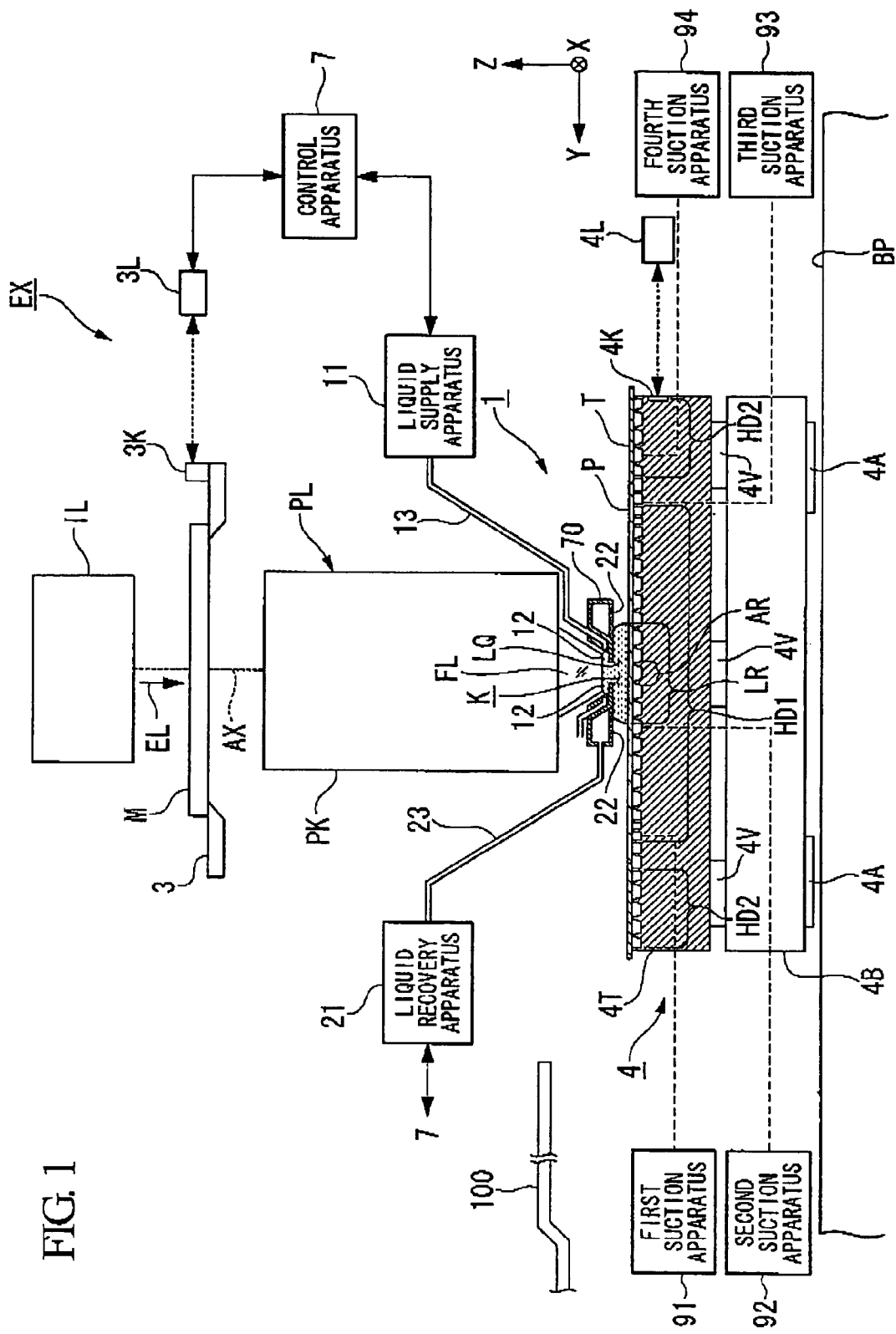
FIG. 1 is a schematic block diagram that shows the exposure apparatus according to the present embodiment.

FIG. 1 is a schematic block diagram that shows the exposure apparatus EX according to the present embodiment. In FIG. 1, the exposure apparatus a comprises a mask stage 3, which holds a mask M and is movable; a movable substrate stage 4, which holds a substrate P and is movable; an illumination system IL, which illuminates the mask M held by the mask stage 3 with exposure light EL; a projection optical system PL, which projects an image of a pattern of the mask M that is illuminated by the exposure light EL onto the substrate A; an immersion system 1, which forms an immersion region LR on an object (e.g., the substrate P) that opposes the projection optical system PL so that an optical path space K of the exposure light EL in the vicinity of the image plane of the projection optical system PL is filled with a liquid LQ; and a control apparatus 7, which controls the operation of the entire exposure apparatus EX. In addition, the exposure apparatus EX comprises a transport apparatus 100 that loads and unloads the substrate P to and from the substrate stage 4.

Furthermore, the substrate P described herein includes one wherein a photosensitive material (photoresist) and a film, such as a protective film, are coated on a base material, e.g., a semiconductor wafer. The mask M includes a reticle wherein a device pattern is formed that is reduction projected onto the substrate P. In addition, a transmitting type mask is used as the mask M in the present embodiment, but a reflection type mask may also be used.

The illumination system IL illuminates a prescribed illumination area on the mask M with the exposure light EL, which has a uniform luminous flux intensity distribution. Examples of light that can be used as the exposure light EL emitted from the illumination system IL include: deep ultraviolet (DUV) light such as bright line (g-line, h-line, or i-line) light emitted from, for example, a mercury lamp and KrF excimer laser light (248 nm wavelength); and vacuum ultraviolet (VUV) light such as ArF excimer laser light (193 nm wavelength) and F2 laser light (157 nm wavelength). ArF excimer laser light is used as the exposure light EL in the present embodiment.

The mask stage 3, in the state wherein it holds the mask M, is movable in the X axial, Y axial, and θZ directions by a mask stage drive apparatus that comprises actuators, e.g., linear motors. Laser interferometers 3L measure the positional information of the mask stage 3 (and, thus, the mask M). The laser interferometers 3L use reflecting surfaces 3K, which are provided on the mask stage 3, to measure the positional information of the mask stage 3. The control apparatus 7 controls the mask stage drive apparatus based on the measurement results of the laser interferometers 3L so as to control the position of the mask M, which is held by the mask stage 3.

Furthermore, the reflecting mirrors 3K need not simply be plane mirrors, but may include corner cubes (retroreflectors); furthermore, it is acceptable to form, for example, reflecting surfaces by minor polishing end surfaces (side surfaces) of the mask stage 3 instead of providing the reflecting mirrors 3K so that they are fixed to the mask stage 3. In addition, the mask stage 3 may be configured so that it is coarsely and finely movable, as disclosed in, for example, Japanese Patent Application Publication No. H8-130179 A (corresponding U.S. Pat. No. 6,721,034).

The projection optical system PL projects the image of the pattern of the mask M to the substrate P at a prescribed projection magnification and comprises a plurality of optical elements, which are held by a lens barrel PK. The projection optical system PL of the present embodiment is a reduction system, the projection magnification of which is, for example, ¼, ⅕, or ⅛, and forms a reduced image of the pattern of the mask M in a projection region, which is optically conjugate with the illumination area discussed above. Furthermore, the projection optical system PL may be a reduction system, a unity magnification system, or an enlargement system. In the present embodiment, an optical axis AX of the projection optical system PL is parallel to the Z axial directions. In addition, the projection optical system PL may be: a dioptric system that does not include catoptric elements; a catoptric system that does not include dioptic elements; or a catadioptric system that includes both catoptic elements and dioptric elements. In addition, the projection optical system PL may form either an inverted image or an erect image.

The substrate stage 4 comprises: a sage main body 4B; a table 4T that is mounted on the stage main body 4B; a tint holder HD1 that is provided to the table 4T and detachably holds the substrate P; a plate member T that is disposed so that it surrounds the circumference of the substrate P, which is held by the first holder HD1; and a second holder HD2 that is provided to the table 4T and detachably holds the plate member T.

The stage main body 4B is noncontactally supported by air bearings 4A with respect to the upper surface (guide surface)

of a base member BP. The upper surface of the base member BP is substantially parallel to the XY plane, and the substrate stage 4 is capable of moving on the base member BP in the X and Y directions.

The substrate stage 4 can be moved on the base member BP by a substrate stage drive apparatus, which comprises actuators such as linear motors, in the state wherein the first holder HD1 holds the substrate P. The substrate stage drive apparatus comprises: a first drive system that is capable of moving the table 4T, which is mounted on the stage main body 4B, in the X axial; the Y axial, and the θZ directions by moving the stage main body 4B on the base member BP in the X axial, the Y axial, and the θZ directions; and a second drive system, which is capable of moving the substrate table 4T in the Z axial, the θX, and the θY directions with respect to the stage main body 4B.

The first drive system comprises actuators such as linear motors. The second drive system comprises: actuators 4V, such as voice coil motor; that are interposed between the stage main body 4B and the table 4T; and a apparatus (e.g., an encoder; not shown) that measures the amount of drive of each of the actuators 4V. The table 4T is supported on the stage main body 4B by at least three actuators 4V. Each of the actuators 4V is capable of driving the table 4T with respect to the stage main body 4B independently in the Z axial directions, and the control apparatus 7 drives the table 4T with respect to the stage main body 4B in the Z axial directions, the θX directions, and the θY directions by adjusting the amount of drive of each of the three actuators 4V. Thus, the substrate stage drive apparatus, which includes the first and second drive systems, is capable of moving the table 4T of the substrate stage 4 with six degrees of freedom, i.e., in the X axial, the Y axial, the Z axial, the θX, the θY, and the θZ directions. By controlling the substrate stage drive apparatus, the control apparatus 7 can control the position of the front surface of the substrate P, which is held by the first holder HD1 of the table 4T, with six degrees of freedom, i.e., in the X axial, the Y axial, the Z axial, the θX, the θY, and the θZ directions.

Laser interferometers 4L measure the positional information of the table 4T of the substrate stage 4 (and, in turn, the substrate P). The laser interferometers 4L use reflecting surfaces 4K, which are provided to the table 4T, to measure the positional information of the table 4T in the X axial, the Y axial, and the θZ directions. In addition, a focus and level detection system (not shown) detects the surface position information (positional information in the Z arial, the θX and the θY directions) of the front surface of the substrate P, which is held by the first holder HD1 of the table 4T. The control apparatus 7 controls the substrate stage drive apparatus based on the measurement results of the laser interferometers 4L and the detection results of the focus and level detection system so as to control the position of the substrate P, which is held by the first holder HD1.

The focus and level detection system detects inclination information (the rotational angle) of the substrate P in the θX and the θY directions by measuring the positional information of the substrate P in the Z axial directions at a plurality of measurement points. Furthermore, if, for example, the laser interferometers 4L are capable of measuring the positional information of the substrate P in the Z axial, the θX, and the θY directions, then the focus and level detection system does not need to be provided so that the positional information of the substrate P can be measured in the Z axial directions du the exposure operation, and the position of the substrate P in the Z axial, the θX, and the θY directions may be controlled using the measurement results of the laser interferometers 4L at least dung the exposure operation.

The immersion system 1 fills the optical path space K of the exposure light EL in the vicinity of the image plane of the projection optical system PL with the liquid LQ. For example, dung the exposure of the substrate P the immersion system 1 forms the immersion region LR on the substrate P so that the optical path space K of the exposure light EL between the lower surface of a last optical element FL, which is the optical element of the plurality of optical elements of the projection optical system PL that is closest to the image plane thereof, and the front surface of the substrate P on the substrate stage 4 (the first holder HD1), which is disposed at a position at which it opposes the last optical element FL, is filled with the liquid LQ. In the present embodiment, water (pure water) is used as the liquid LQ.

The immersion system 1 comprises: a nozzle member 70, which is provided in the vicinity of the optical path space K of the exposure light EL and comprises supply ports 12, which supply the liquid LQ to the optical path space K, and a recovery port 22, which recovers the liquid LQ; supply pipes 13; a liquid supply apparatus 11, which supplies the liquid LQ to the supply ports 12 via supply passageways that are formed inside the nozzle member 70; and a liquid recovery apparatus 21, which recovers the liquid LQ that is recovered via the recovery port 22 of the nozzle member 70 via a recovery passageway 24, which is formed inside the nozzle member 70, and a recovery pipe 23. In the present embodiment, the nozzle member 70 is annularly provided so that it surrounds the optical path space K of the exposure light EL. The supply ports 12 supply the liquid LQ are provided in the vicinity of the optical path space K of the exposure light EL. The recovery port 22 that recovers the liquid LQ is provided to a lower surface of the nozzle member 70 and opposes the front surface of the substrate P, for example, during the exposure of the substrate P. In the present embodiment, the recovery port 22 is provided so that it is further spaced apart from the optical path space K of the exposure light EL than the supply ports 12 are. In addition, in the present embodiment, a porous member (mesh) is disposed in the recovery port 22.

The liquid supply apparatus 11 comprises: a temperature adjusting apparatus, which adjusts the temperature of the liquid LQ that is to be supplied; a degasifier that reduces a gas component in the liquid LQ; and a filter unit, which eliminates foreign matter in the liquid LQ; in addition, the liquid supply apparatus 11 is capable of feeding the pure, temperature adjusted liquid LQ. In addition, the liquid recovery apparatus 21 comprises, for example, a vacuum system and is capable of recovering the liquid LQ. The control apparatus 7 controls the operation of the immersion system 1, which includes the liquid supply apparatus 11 and the liquid recovery apparatus 21. After the liquid LQ that is fed from the liquid supply apparatus 11 flows through the supply pipes 13 and the supply passageways of the nozzle member 70, it is supplied to the optical path space K of the exposure light EL via the supply ports 12. In addition, the liquid LQ that is recovered via the recovery port 22 by the operation of the liquid recovery apparatus 21 flows through the recovery passageway 24 of the nozzle member 70, and is then recovered by the liquid recovery apparatus 21 via the recovery pipe 23. The control apparatus 7 forms the immersion region LR of the liquid LQ on the object (e.g., the substrate P) that opposes the last optical element FL so that the optical path space K of the exposure light EL is filled with the liquid LQ by controlling the liquid immersion system 1 so that the liquid supply operation, wherein the liquid supply apparatus 11 is used, and the liquid recovery operation, wherein the liquid recovery apparatus 21 is used, are performed in parallel.

The exposure apparatus EX projects the image of the pattern of the mask M onto the substrate P, which is held by the first holder HD1, by radiating the exposure light EL that passes through the mask M onto the substrate P through the projection optical system PL and the liquid LQ that fills the optical path space K of the exposure light EL, and thereby exposes the substrate P. In addition, the exposure apparatus EX of the present embodiment employs a local liquid immersion system that, during the exposure of the substrate P, fills the optical path space K of the exposure light EL between the last optical element FL and the substrate P with the liquid LQ, and locally forms the immersion region LR of the liquid LQ, which is larger than the projection region AR of the projection optical system PL and smaller than the substrate P, in part of the area on the substrate P that includes the projection region AR.

Figure 2:
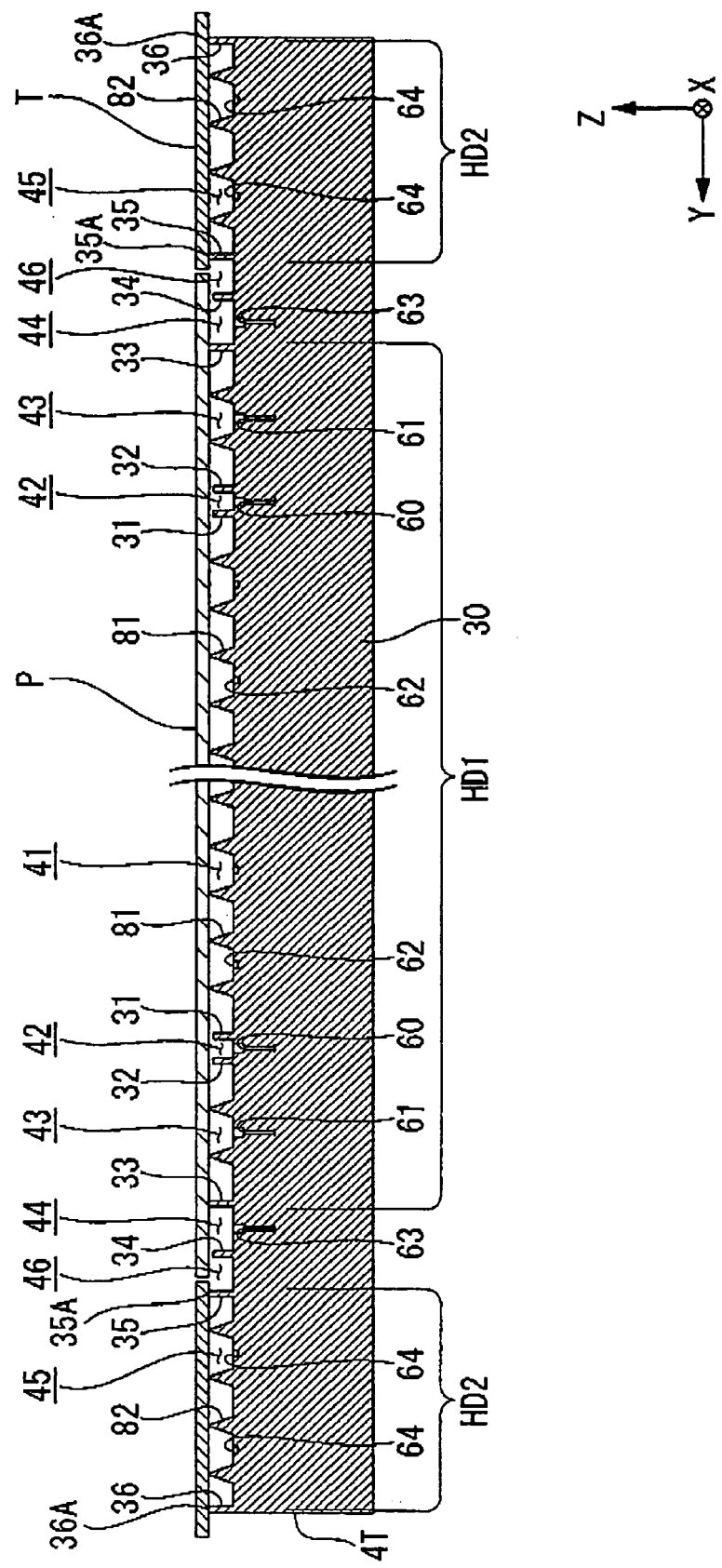
FIG. 2 is a side cross sectional view of a table according to the present embodiment.
Figure 3:
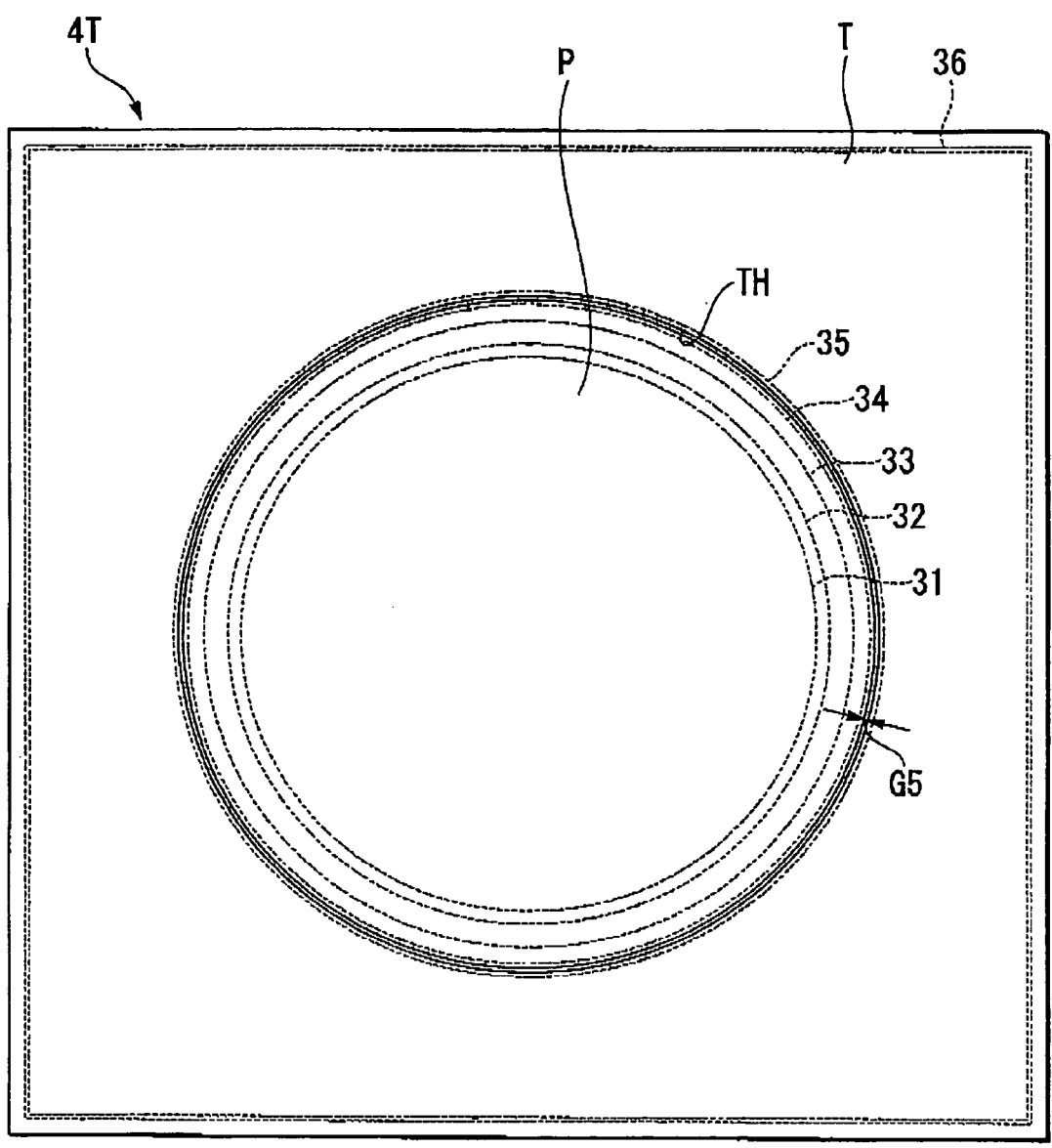
FIG. 3 is a plan view of the table in the state wherein it is holding a substrate.
Figure 4:
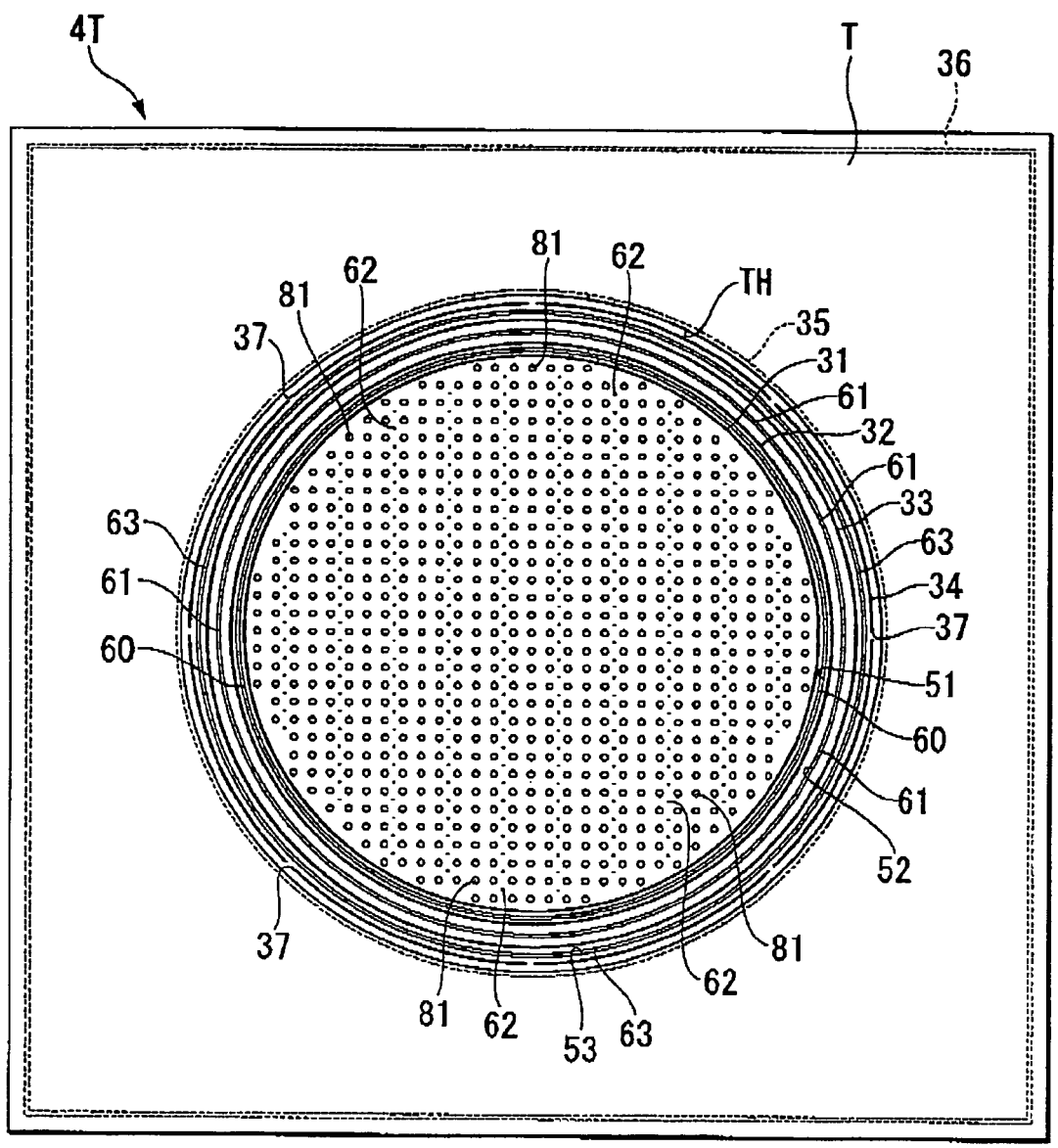
FIG. 4 is a plan view of the table in the state wherein the substrate has been removed.
Figure 5:
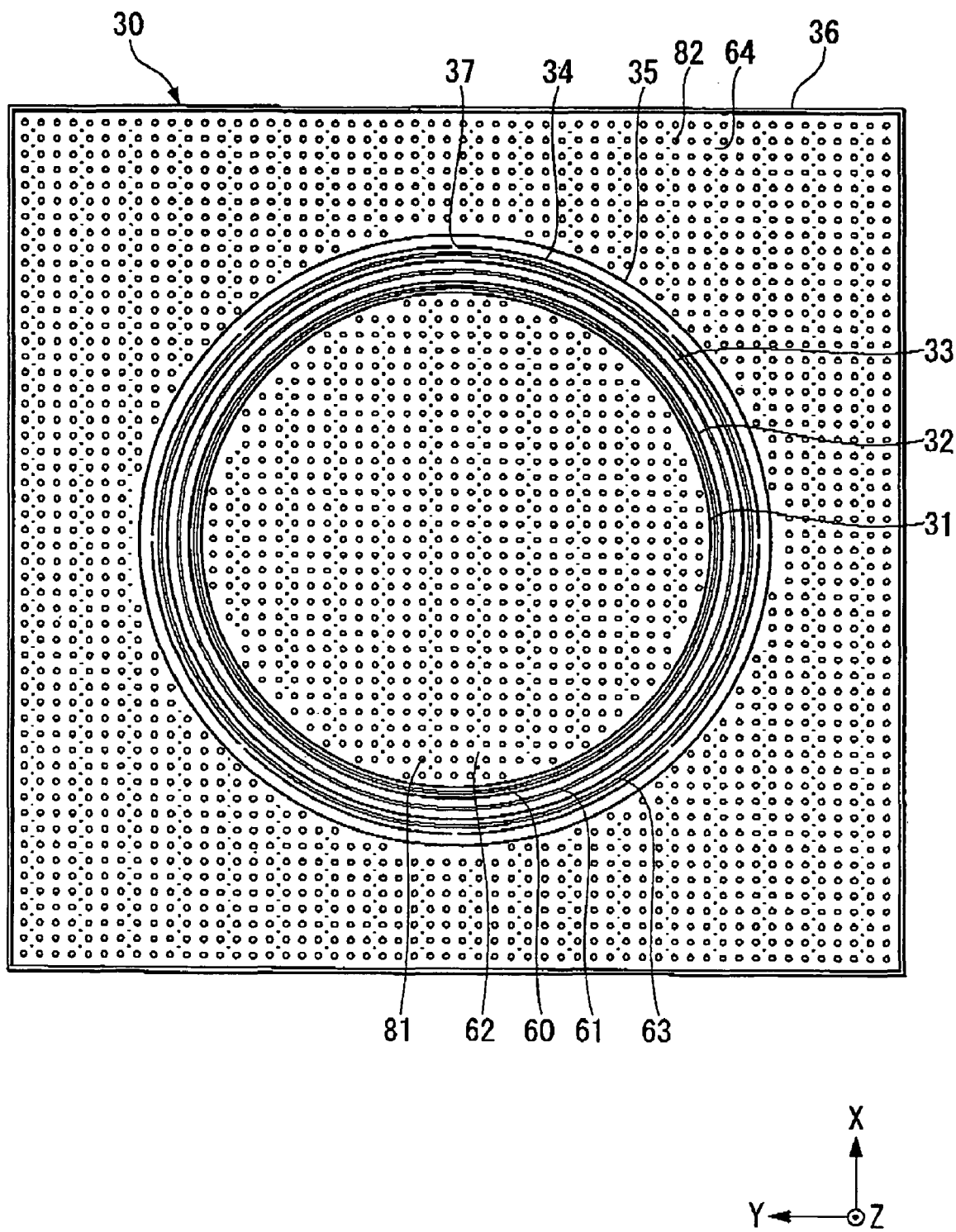
FIG. 5 is a plan view of the state wherein the substrate and a plate member have been removed.
Figure 6:
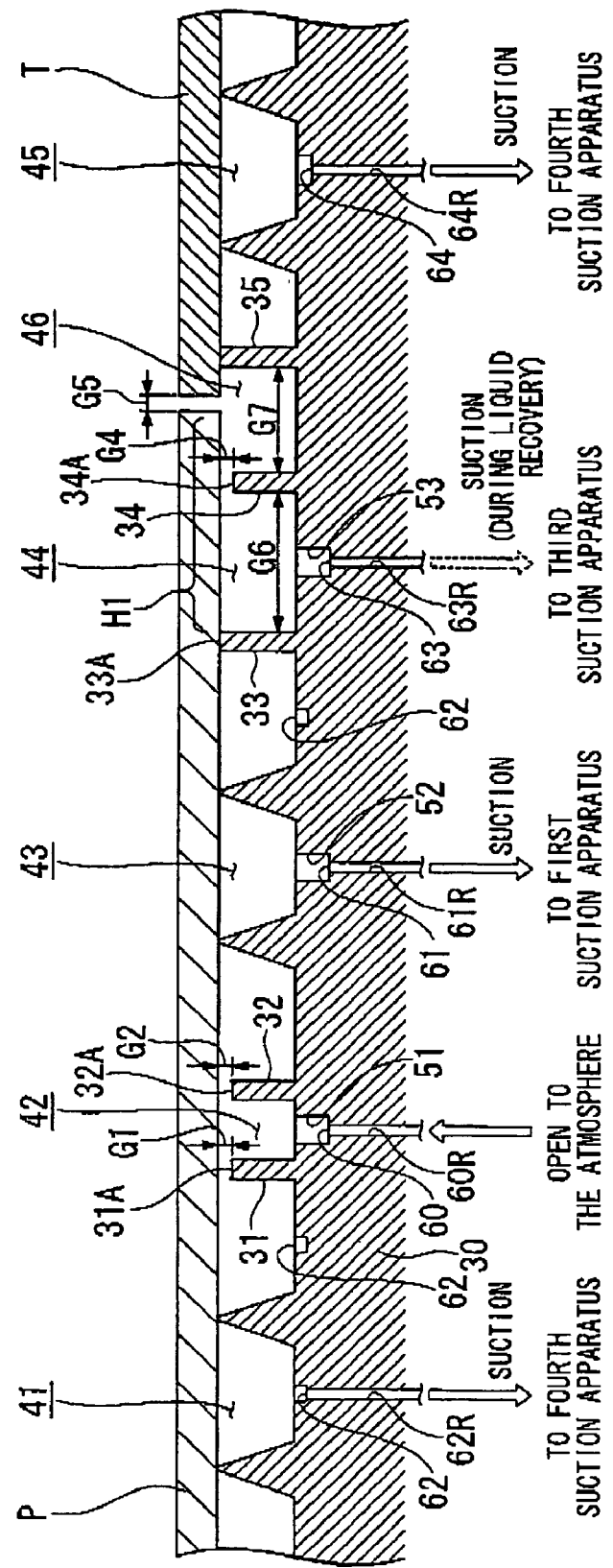
FIG. 6 is a side cross sectional view that shows the principal parts of the table according to the present embodiment.
Figure 7:
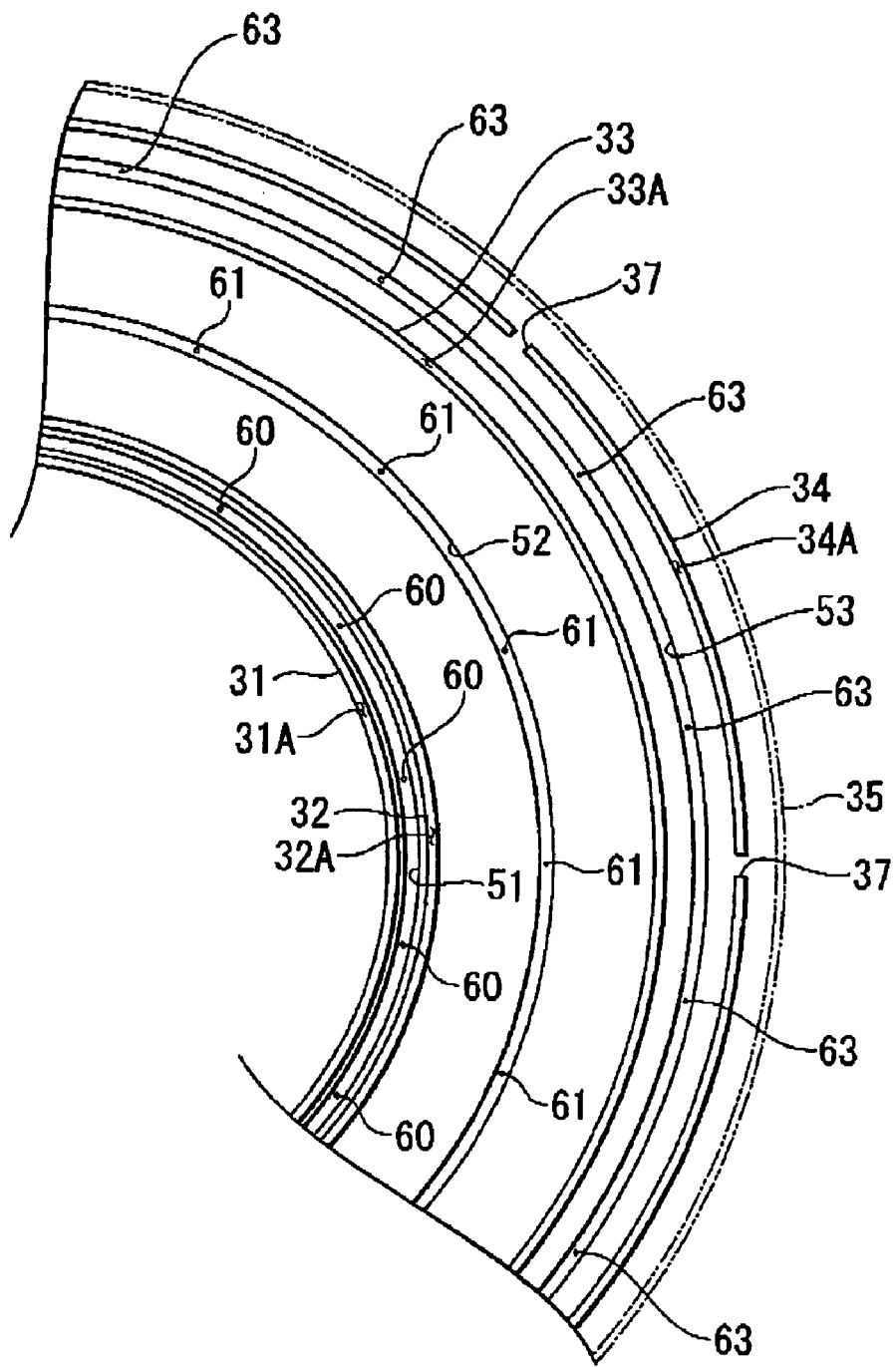
FIG. 7 is a plan view that shows the principal parts of the table according to the present embodiment.

The following explains the table 4T according to the present embodiment, referencing FIGS. 1-7. FIG. 2 is a side cross sectional view of the table 4T in the state wherein the substrate P is held by the first holder HD1; FIG. 3 is a plan view, viewed from above, of the table 4T in the state wherein the substrate P is held by the first holder HD1; FIG. 4 is a plan view, viewed from above, of the table 4T in the state wherein the substrate P is removed from the first holder HD1; FIG. 5 is a plan view of the state we the substrate P and the plate member T are removed from the first and second holders HD1, HD2; FIG. 6 is an enlarged, side cross sectional view of part of the first holder HD1; and FIG. 7 is a plan view.

As shown in FIG. 2 and the like, the table 4T comprises: a base material 30; the first holder HD1 that is provided to the base material 30 and detachably holds the substrate P; and the second holder HD2 that is provided to the base material 30 and detachably holds the plate member T. The plate member T, which is held by the second holder HD2, is disposed so that it surrounds the circumference of the substrate P, which is held by the first holder HD1.

The first holder HD1 will now be explained. As shown in FIGS. 2-7, the first holder HD1 comprises: first support members 81 that are formed on the base material 30 and support a rear surface of the substrate P; a first circumferential wall 31 that is formed on the base material 30, is provided so that it surrounds a first space 41 between the base material 30 and the substrate P, which is supported by the fit support members 81, and has a first upper surface 31A that opposes the rear surface of the substrate P, which is supported by the first support members 81; a second circumferential wall 32 that is formed on the base material 30, is provided so that it surrounds the first circumferential wall 31, and has a second upper surface 32A that opposes the rear surface of the substrate P, which is supported by the first support members 81; a third circumferential wall 33 that is formed on the base material 30, is provided so that it surrounds the first support members 81 and the second circumferential wall 32, and has a third upper surface 33A that opposes the rear surface of the substrate P, which is supported by the first support members 81; fluid flow ports 60 that are capable of supplying a gas to a second space 42 between the first circumferential wall 31 and the second circumferential wall 32; and first suction ports 61, which suction fluid from a third space 43 that is between the second circumferential wall 32 and the third circumferential wall 33.

The first circumferential wall 31 is ring shaped (substantially circular) and is substantially the same shape as the external shape of the substrate P. The first upper surface 31A of the first circumferential wall 31 is provided so that it opposes an area that is relatively close to the circumferential edge of the rear surface of the substrate P, which is supported by the first support members 81. The first space 41, which is enclosed by the rear surface of the substrate P, the first circumferential wall 31, and the base material 30, is formed at the rear surface side of the substrate P, which is held by the first holder HD1.

The second circumferential wall 32 is formed along and at the outer (lateral) side of the first circumferential wall 31 with respect to the first space 41. The first circumferential wall 31 and the second circumferential wall 32 are spaced apart by a prescribed spacing (e.g., 1 mm). The second circumferential wall 32 is also ring shaped (substantially circular) and is substantially the same shape as the external shape of the substrate P. The second upper surface 32A of the second circumferential wall 32 is provided so that it opposes an area that is relatively close to de circumferential edge of the rear surface of the substrate P, which is supported by the first support members 81. The second space 42, which is enclosed by the rear rice of the substrate the first circumferential wall 31, the second circumferential wall 32, and the base material 30, is formed at the rear surface side of the substrate P, which is held by the first holder HD1.

The third circumferential wall 33 is formed at the outer side of the first circumferential wall 31 and the second circumferential wall 32 with respect to the first space 41 so that it is spaced apart from the second circumferential wall 32 by a prescribed distance. The third circumferential wall 33 is also ring shaped (substantially circular) and is substantially the same shape as external shape of the substrate P. The third upper surface 33A of the third circumferential wall 33 is provided so that it opposes a circumferential edge area (edge area) of the rear surface of the substrate P, which is supported by the first support members 81. The third space 43, which is enclosed by the rear surface of the substrate P, the second circumferential wall 32, the third circumferential wall 33, and the base material 30, is formed at the rear surface side of the substrate P, which is held by the first holder HD1.

As discussed above, the first, second, and third circumferential walls 31, 32, 33 are all provided so that they oppose the edge area of the rear surface of the substrate P, which is supported by the first support members 81, or an area that is close to that edge area.

In the present embodiment, the first, second, and third circumferential walls 31, 32, 33 are disposed so that they are substantially concentric. The first holder HD1 holds the substrate P so that the center of the first space 41 and the center of the rear surface of the substrate P substantially coincide.

In addition, in the present embodiment, the outer diameter of the third circumferential wall 33 is smaller than that of the substrate. In other words, the third circumferential wall 33 is provided at the inner (medial) side of the edge (i.e., at the center side) of the substrate P, which is supported by the first support members 81. Part of the edge area of the substrate P, which is supported by the first support members 81, hangs over the outer side of the third circumferential wall 33 by a prescribed amount. In the explanation below, the area of the rear surface of the substrate P that hangs over the outer side of the third circumferential wall 33 is appropriately called au overhang area H1 (refer to FIG. 6). In the present embodiment, the width of the overhang area H1 is approximately 1.5 mm.

As shown in FIG. 6, in the present embodiment, a first gap G1 is formed between the rear surface of the substrate P, which is supported by the first holder HD1, and the first upper surface 31A of the first circumferential wall 31. In addition, a second gap G2 is formed between the rear surface of the substrate P, which is supported by the first holder HD1, and the second upper surface 32A of the second circumferential wall 32. The third circumferential wall 33 is formed so that the rear surface of the substrate P, which is supported by the first holder HD1, and the third upper surface 33A contact one another.

In the present embodiment, the first gap G1 and the second gap G2 are each approximately 2-10 µm. In addition, in the present embodiment, the width of each of the first, second, and third upper surfaces 31A, 32A, 33A is approximately 0.5 mm.

The fluid flow ports 60 are connected to the second space 42. In the present embodiment, multiple fluid flow ports 60 are formed in the base material 30 between the first circumferential wall 31 and the second circumferential wall 32 at prescribed intervals in the circumferential directions at the outer side of the first circumferential wall 31 so that they surround the first circumferential wall 31, as shown in FIG. 4, FIG. 5, FIG. 7, and the like. In the present embodiment, each of the fluid flow ports 60 is circular, but may be polygonal. In addition, in the present embodiment, the fluid flow ports 60 are disposed so that they are substantially equispaced.

As shown in FIG. 6 and the like, the second space 42 and the exterior space (the atmospheric space) are connected via the fluid flow ports 60. Namely, the gas can circulate between the second space 42 and the exterior space via the fluid flow ports 60 and a passageway 60R, which is connected to the fluid flow ports 60. The second space 42 is open to the atmosphere via the fluid flow ports 60.

In the present embodiment, an annular first groove 51 is formed in the base material 30 between the first circumferential wall 31 and the second circumferential wall 32 and along and at the outer side of the first circumferential wall 31 so that it surrounds the first circumferential wall 31. The fluid flow ports 60 are formed on the inner side of the first groove 51 (in a bottom part of the first groove 51).

As shown in FIG. 1, FIG. 6, and the like, the first suction ports 61, which are formed between the second circumferential wall 32 of the base material 30 and the third circumferential wall 33, are connected to a first suction apparatus 91, which comprises a vacuum system and the like, via a passageway 61R. In addition, the first suction ports 61 are connected to the third space 43. The control apparatus 7 drives the first suction apparatus 91 in order to suction the fluid (including at least one of the gas and the liquid) from the third space 43.

In the present embodiment, multiple first suction ports 61 are formed in the base material 30 between the second circumferential wall 32 and the third circumferential wall 33 at prescribed intervals in the circumferential directions at the outer side of the second circumferential wall 32 so that they surround the second circumferential wall 32. In the present embodiment, each of the first suction ports 61 is circular, but may be polygonal. In addition, in the present embodiment, the first suction ports 61 are disposed so that they are substantially equispaced.

In addition, in the present embodiment, an annular second groove 52 is formed in the base material 30 between the second circumferential wall 32 and the third circumferential wall 33 along the second circumferential wall 32 so that it surrounds the second circumferential wall 32. The first suction ports 61 are formed on the inner side of the second groove 52 (in the bottom part of the second groove 52).

The first support members 81 are pin shaped projecting parts that are formed on the upper surface of the base material 30, and multiple first port members 81 are disposed at prescribed positions of the upper surface of the base material 30. In the present embodiment, the plurality of the first support members 81 is disposed at the inner side of the first circumferential wall 31. In addition, the plurality of the first support members 81 is disposed between the second circumferential wall 32 and the second groove 52 and between the second groove 52 and the third circumferential wall 33.

Furthermore, in FIG. 4 and FIG. 5, the first support members 81 inside the third space 43 are not shown for the sake of simplicity. However, if the flatness of the front surface Pa of the substrate P can be ensured sufficiently, then the first support members 81 do not have to be provided in the third space 43.

Multiple second suction ports 62, which suction the fluid principally gas) in order to negatively pressurize the first space 41 and the third space 43 with respect to the atmospheric pressure, are provided in the base material 30. The second suction ports 62 are provided at the inner side of the first circumferential wall 31 and between the second circumferential wall 32 and the third circumferential wall 33. The second suction ports 62 are used solely to chuck the substrate P.

The second suction ports 62 are formed at the inner side of the first circumferential wall 31 at a plurality of prescribed positions that are different than the positions of the first support members 81. In addition, the second suction ports 62 are formed between the second circumferential wall 32 and the third circumferential wall 33 at positions that are more spaced apart from the second circumferential wall 32 than the first suction ports 61 are. Namely, the multiple second suction ports 62 are provided in the upper surface of the base material 30 between the second circumferential wall 32 and the third circumferential wall 33 at prescribed positions between the second groove 52 and the third circumferential wall 33, and are not provided between the second circumferential wall 32 and the second groove 52.

Furthermore, in FIG. 2, FIG. 4, and FIG. 5, the second suction ports 62, which are provided between the second groove 52 and the third circumferential wall 33, are not shown for the sake of simplicity. However, the second suction ports 62 between the second groove 52 and the third circumferential wall 33 do not have to be provided if the flatness of the front surface Pa of the substrate P can be sufficiently ensured solely by the second suction ports 62 provided at the inner side of the first circumferential wall 31, and the substrate P can be held so that it is does not move.

As shown in FIG. 1, FIG. 6, and the like, the second suction ports 62 are connected to a second suction apparatus 92, which comprises a vacuum system and the like, via a passageway 62R, and are connected to the first space 41 and the third space 43. The control apparatus 7 can suction the fluid (including at least one of the gas and the liquid) from the first and third spaces 41, 43 by operating the second suction apparatus 92. The control apparatus 7 negatively pressurizes the first space 41 and the third space 43 by operating the second suction apparatus 92 so as to suction the gas from the first space 41, which is enclosed by the rear surface of the substrate P, the first circumferential wall 31, and the base material 30, as well as the fluid (principally gas) from the third space 43, which is enclosed by the rear surface of the substrate P, the second circumferential wall 32, the third circumferential wall 33, and the base material 30; thereby, the substrate P is chucked to the first support members 81. In addition, the substrate P can be removed from the first holder HD1 by canceling the suction operation that is performed by the second suction apparatus 92. Thus, in the present embodiment, the substrate P can be chucked to and dechucked from the first holder HD1 by controlling the suction operation wherein the second suction ports 62 are used. The first holder HD1 in the present embodiment is part of a so-called pin chuck mechanism.

In addition, the table 4T comprises: a fourth circumferential wall 34 that is formed at the base material 30, is provided so that it surrounds the third circumferential wall 33, and has a fourth upper surface 34A that opposes the rear surface of the substrate P, which is supported by the first support members 81; and third suction ports 63, which suction the fluid from the space between the third circumferential wall 33 and the fourth circumferential wall 34. The fourth circumferential wall 34 is formed at the outer side of the third circumferential wall 33 with respect to the third space 43, and is spaced apart from the third circumferential wall 33 by a prescribed distance. The fourth circumferential wall 34 is formed along the third circumferential wall 33. The fourth circumferential wall 34 is also ring shaped (substantially circular) and is substantially the same shape as the external shape of the substrate P. However, as described below, the fourth circumferential wall 34 in the present embodiment is not formed continuously, and comprises a plurality of arcuate circumferential wall parts.

The fourth upper surface 34A of the fourth circumferential wall 34 opposes the overhang area H1 of the rear surface of the substrate P, which is supported by the first support members 81. In the present embodiment, a fourth gap G4 is formed between the overhang area H1 of the rear surface of the substrate P, which is supported by the first support members 81, and the fourth upper surface 34A of the fourth circumferential wall 34. In the present embodiment, the fourth gap G4 is set to, for example, approximately 1-10 μm. In addition, in the present embodiment, the width of the fourth upper surface 34A is set to approximately 0-5 mm.

As shown in FIG. 1, FIG. 6, and the like, the third suction ports 63 are connected to a third suction apparatus 93, which comprises a vacuum system and the like, via a passageway 63R. In addition, the third suction ports 63 are connected to a fourth space 44 between the third circumferential wall 33 and the fourth circumferential wall 34. The fourth space 44 is enclosed by the overhang area H1 of the rear surface of the substrate P, the third circumferential wall 33, the fourth circumferential wall 34, and the base material 30. The control apparatus 7 is capable of suctioning the fluid (at least one of the gas and the liquid) of the fourth space 44 by operating the third suction apparatus 93.

In the present embodiment, multiple third suction ports 63 are formed in the base material 30 between the third circumferential wall 33 and the fourth circumferential wall 34 at the outer side of the third circumferential wall 33 at prescribed intervals in the circumferential directions so that they surround the third circumferential wall 33. In the present embodiment, the third suction ports 63 are circular, but may be polygonal. In addition, the third suction ports 63 in the present embodiment are disposed along the third circumferential wall 33 at substantially equal intervals.

In addition, in the present embodiment, an annular third groove 53 is formed in the base material 30 between the third circumferential wall 33 and the fourth circumferential wall 34 and along and at the outer side of the third circumferential wall 33 so that it surrounds the third circumferential wall 33. The third suction ports 63 are formed on the inner side of the third groove 53 (in the bottom part of the third groove 53).

In addition, slits 37 are formed in parts of the fourth circumferential wall 34. The slits 37 are formed at prescribed positions in the circumferential directions of the fourth circumferential wall 34. In the present embodiment, the slits 37 are disposed at substantially equal intervals in the circumferential directions of the fourth circumferential wall 34.

In the present embodiment, the slits 37 are formed so that they extend in the vertical directions (the Z axial directions), and the lower ends thereof reach the base material 30. Moreover, the upper ends of the slits 37 reach the fob upper surface 34A of the fourth circumferential wall 34. Accordingly, the fourth circumferential wall 34 in the present embodiment is configured by a combination of multiple protruding pan which are arcuate in a plan view; in addition, the provision of these arcuate protruding parts along the third circumferential wall 33 forms a substantially ring shape as a whole.

In addition, the third suction ports 63 are disposed between adjacent slits 37. In the present embodiment, two third suction ports 63 are disposed between adjacent slits 37.

As shown in FIG. 7, each of the fluid flow ports 60 is disposed between adjacent first suction ports 61. Namely, the fluid flow ports 60 and the first suction ports 61 are provided at different positions in the circumferential directions. Imagining a set of straight lines that extend radially from the center of the first space 41, which is circular in a plan view, the fluid flow ports 60 and the first suction ports 61 are disposed at positions such that none of the fluid flow ports 60 and the first suction ports 61 are formed along the same straight line.

The following explains the plate member T and the second holder HD2, which detachably holds the plate member T. The plate member T is a member that is separate from the table 4T, and is detachable with respect to the base material 30. In addition, as shown in FIG. 3 and the like, a substantially circular hole JA, in which the substrate P can be disposed, is formed at the center part of the plate member T. The plate member T, which is held by the second holder HD2, is disposed so that it surrounds the substrate P, which is held by the first holder HD1. In the present embodiment, the front surface of the plate member T which is held by the second holder HD2, is a flat surface that is configured so that it is substantially the same height as (flush with) the front surface of the substrate P, which is held by the first holder HD1. Furthermore, there may be a level difference between the front surface of the substrate P, which is held by the first holder HD1, and the front surface of the plate member T, which is held by the second holder HD2.

A fifth gap G5 is formed between the edge (outer side surface) of the substrate P, which is held by the first holder HD1, and the edge (inner side surface) on the inner side of the plate member-T, which is held by the second holder HD2. The fifth gap 65 is set to, for example, approximately 0.1-10 nm. In addition, the external shape of the plate member T is rectangular in a plan view and is substantially the same shape as the external shape of the base material 30 in the present embodiment.

The plate member T is liquid repellent with respect to the liquid LQ. The plate member T is made of a liquid repellent material, e.g., a fluororesin such as polytetrafluoroethylene (Teflon™), or an acrylic resin. Furthermore, the plate member T may be formed from, for example, a metal, and its surface may be coated with a liquid repellent material such as a fluororesin.

The second holder HD2 comprises second support members 82 that are formed on the base material 30 and support the rear surface of the plate member T. In addition, the second holder HD2 comprises: a fifth circumferential wall 35 that is formed on the base material 30, is provided so that it surrounds the fourth circumferential wall 34, and has a fifth upper surface 35A that opposes the rear spice of the plate member T, which is supported by the second support members 82, and a sixth circumferential wall 36 that is formed on the base material 30, is provided so that it surrounds the fifth circumferential wall 35, and has a sixth upper surface 36A that opposes the rear surface of the plate member T, which is supported by the second support members 82. The second support members 82 are formed on the base material 30 between the fifth circumferential wall 35 and the sixth circumferential wall 36.

The fifth upper surface 35A of the fifth circumferential wall 35 is provided so that it opposes an inner edge area (edge area onto inner side) of the rear surface of the plate member T, which is supported by the second support members 82, in the vicinity of the hole TH. In addition, the sixth upper surface 36A of the circumferential wall 36 is provided so that it opposes an outer edge area (edge area on the outer side) of the rear surface of the plate member T, which is supported by the second support members 82. A fifth space 45, which is enclosed by the rear surface of the plate member T, the fifth circumferential wall 35, the sixth circumferential wall 36, and the base material 30, is formed at the rear surface side of the plate member T, which is held by the second holder HD2. The plate member T is supported on the second support members 82 of the second holder HD2 by negatively pressuring the fifth space 45.

In the present embodiment, the fifth circumferential wall 35 is formed so that the rear surface of the plate member T, which is supported by the second support members 82, and the fifth upper surface 35A contact one another. The sixth circumferential wall 36 is formed so that the rear surface of the plate member T, which is supported byte second support members 82, and the sixth upper surface 36A contact one another.

The second support members 82 are pin shaped projecting parts that are formed on the upper surface of the base material 30 and are disposed at multiple prescribed positions on the upper surface of the base material 30 between the fifth circumferential wall 35 and the sixth circumferential wall 36.

Fourth suction ports 64, which suction the fluid (principally gas) from the interior of the fifth space 45 in order to negatively pressurize the fifth space 45, are provided in the base mal 30 between the fifth circumferential wall 35 and to sixth circumferential wall 36. The fourth suction ports 64 are used solely to chuck the plate member T. The fourth suction ports 64 are formed in the base material 30 between the fifth circumferential wall 35 and the sixth circumferential wall 36 at prescribed positions that are different than the positions of the second support members 82.

As shown in FIG. 1, FIG. 6, and the like, the fourth suction ports 64 are connected to the fifth space 45 and to a fourth suction apparatus 94, which comp a vacuum system and the like, via a passageway 64R. The control apparatus 7 is capable of suctioning the fluid (at least one of the gas and the liquid) of the fifth space 45 by operating the fourth suction apparatus 94. The control apparatus 7 negatively pressurizes the fifth spa 45 by operating the fourth suction apparatus 94 so as to suction the fluid (principally gas) from the fifth space 45, which is enclosed by the rear surface of the plate member T supported by the second support members 82, the fifth circumferential wall 35, the sixth circumferential wall 36, and the base material 30; thereby, the plate member T is chucked to the second support members 82. In addition, it is possible to remove the plate member T from the second holder HD2 by canceling the suction operation that is performed by the fourth suction apparatus 94. Thus, in the present embodiment, the plate member T can be chucked to and dechucked from the second holder HD2 by controlling the suction operation wherein the fourth suction ports 64 are used. In the present embodiment, the second holder HD2 is part of the so-called pin chuck mechanism.

In addition, as shown in FIG. 6 and the like, a sixth space 46 that is enclosed by the overhang area H1 of the rear surface of the substrate P supported by the first support members 81, the fourth circumferential wall 34, the fifth circumferential wall 35, and the base material 30, is connected to the exterior space (the atmospheric space) via the fifth gap G5 that is formed between the substrate P, which is supported by the first support members 81, and the plate member T, which is supported by the second support members 82.

In addition, as shown in FIG. 6, FIG. 7, and the like, the fourth space 44 is connected to the external space via the fourth gap G4, the fifth gap G5, and the slits 37. Namely, the fluid (at least one of the gas and the liquid) can circulate between the fourth space 44 and the exterior space via the slits 37, the fourth gap G4, and the fifth gap G5.

In addition, a sixth gap G6 of approximately 1 mm is formed between the outer side surface of the third circumferential wall 33 and the inner side surface of the fourth circumferential wall 34. A seventh gap G7 of approximately 1 mm is formed between the outer side surface of the fourth circumferential wall 34 and the inner side surface of the fifth circumferential wall 35.

The following explains the exposure operation of the exposure apparatus EX and the substrate holding operation of the table 4T. In particular, the liquid recovery operation of the table 4T will be explained in detail.

The control apparatus 7 disposes the substrate stage 4 at a prescribed substrate exchange position (loading position) and uses the transport apparatus 100 to load the substrate P, which is to undergo an exposing process, on the first holder HD1 of the table 4T of the substrate stage 4. The control apparatus 7 uses the first support members 81 to chuck the substrate P by driving the second suction apparatus. 92 with a prescribed timing so as to negatively pressurize the first space 41 and the third space 43 via the second suction ports 62. Furthermore, before the substrate P is held by the first holder HD1, the control apparatus 7 drives the fourth suction apparatus 94 so as to negatively pressurize the fifth space 45 via the fourth suction ports 64, and thereby the plate member T is held by the second holder HD2.

In addition, the control apparatus 7 starts the suction operation, wherein the first suction ports 61 are used, by driving the first suction apparatus 91 with a prescribed timing. The control apparatus 7 performs (continues) the suction operation, wherein the first suction ports 61 are used, while the immersion region LR is formed on at least one of the front surface of the subsume P and the front surface of the plate member T. In the present embodiment, the control apparatus 7: loads the substrate P on the first holder HD1; immediately thereafter, starts the suction operation wherein the second suction ports 62 are used and, simultaneously therewith, starts the suction operation wherein the first suction ports 61 are used; exposes the substrate P, which is held by the first holder HD1; and then continues the suction operation, wherein the first suction ports 61 are used, until immediately before the substrate P is unloaded from the first holder HD1 after the exposure is complete. Furthermore, the suction operation, wherein the first suction ports 61 are used, may be started after the performance of the suction operation, wherein the second suction ports 62 are used, and the substrate P is held by the first holder HD1. The suction operation when the first suction ports 61 are used should be started before the immersion region LR is formed on at least part of the upper surface of the substrate P and the upper surface of the plate member T.

The control apparatus 7 uses the immersion system 1 to form the immersion region LR of the liquid LQ on the substrate P in order to perform an immersion exposure on the substrate P, which is held by the first holder HD1. The control apparatus 7 exposes the substrate P, which is held by the first holder HD1 of the table 4T, through the liquid LQ of the immersion region LR.

For example, when the immersion exposure is performed on an area in the vicinity of the edge of the front surface of the substrate P, part of the immersion region LR is formed on the plate member T at the outer side of the substrate P. Namely, the immersion region LR of the liquid LQ is formed above the fifth gap G5. However, the fifth gap G5 is set to 0.1-1.0 mm, which prevents the liquid LQ from leaking into the fifth gap G5 caused by the surface tension of the liquid LQ. In addition, the plate member T is made liquid repellent which prevents the liquid LQ from leaking to the rear surface side of the substrate P via the fifth gap G5. Accordingly, the liquid LQ can be held below the projection optical system PL even if the area in the vicinity of the edge of the front surface of the substrate P is exposed.

Thus, although the liquid LQ is prevented from leaking via theft gap G5 by, for example, reducing the size of the fifth gap G5 and disposing the liquid repellent plate member T so that it surrounds the substrate P, there is a possibility that the liquid LQ will leak via the fifth gap G5, which is formed around the substrate P, because of, for example, pressure changes in the liquid LQ that forms the immersion region LR. Even if the liquid LQ that leaks into the sixth space 46 via the fifth gap G5 leaks into the fourth space 44 via the fourth gap G4 and the like, the rear surface of the substrate P and the third upper surface 33A of the third circumferential wall 33 contact (closely contact) one another, which makes it possible to prevent the liquid LQ from leaking into the space at the inner side of the third circumferential wall 33. In addition, providing the fourth space 44 makes it possible for the liquid LQ that leaks via, for example, the gaps G5, G4 to be held in the fourth space 44. Furthermore, in the present embodiment, the control apparatus 7 does not perform the suction operation, wherein the third suction ports 63 are used, at least during the exposure of the substrate P. Namely, the control apparatus 7 stops the operation of the third suction apparatus 93 at least during the exposure of the substrate P.

Thus, the table 4T of the present embodiment is configured so that it is difficult for the liquid LQ to leak into the space at the inner side of the third circumferential wall 33 even if the liquid LQ leaks into the fourth space 44. Nevertheless, there is a possibility that the liquid LQ will leak into the space at the inner side of the third circumferential wall 33 as a result of the state wherein a rear surface of the substrate P and the upper surface 33A of the third circumferential wall 33 contact one another. For example, if a gap is formed between the rear surface of the substrate P and the third upper surface 33A of the third circumferential wall 33 for some reason, e.g., warpage in the substrate P or unevenness in the area where the rear surface of the substrate P and the third upper surface 33A of the third circumferential wall 33 contact one another, then there is a possibility that the liquid LQ will leak into the space at the inner side of the third circumferential wall 33 via the space between the rear surface of the substrate P and the third upper surface 33A of the third circumferential wall 33. In the present embodiment, the fluid flow ports 60, which are capable of supplying the gas, are provided at the inner side of the third circumferential wall 33, the first suction ports 61 are provided between the third circumferential wall 33 and the fluid flow ports 60, and the suction operation, wherein the first suction ports 61 are used, is performed, which makes it possible to prevent the liquid LQ from leaking into the first space 41 and the second space 42 even if the liquid LQ were to leak into the space at the inner side of the third circumferential wall 33.

Figure 8:
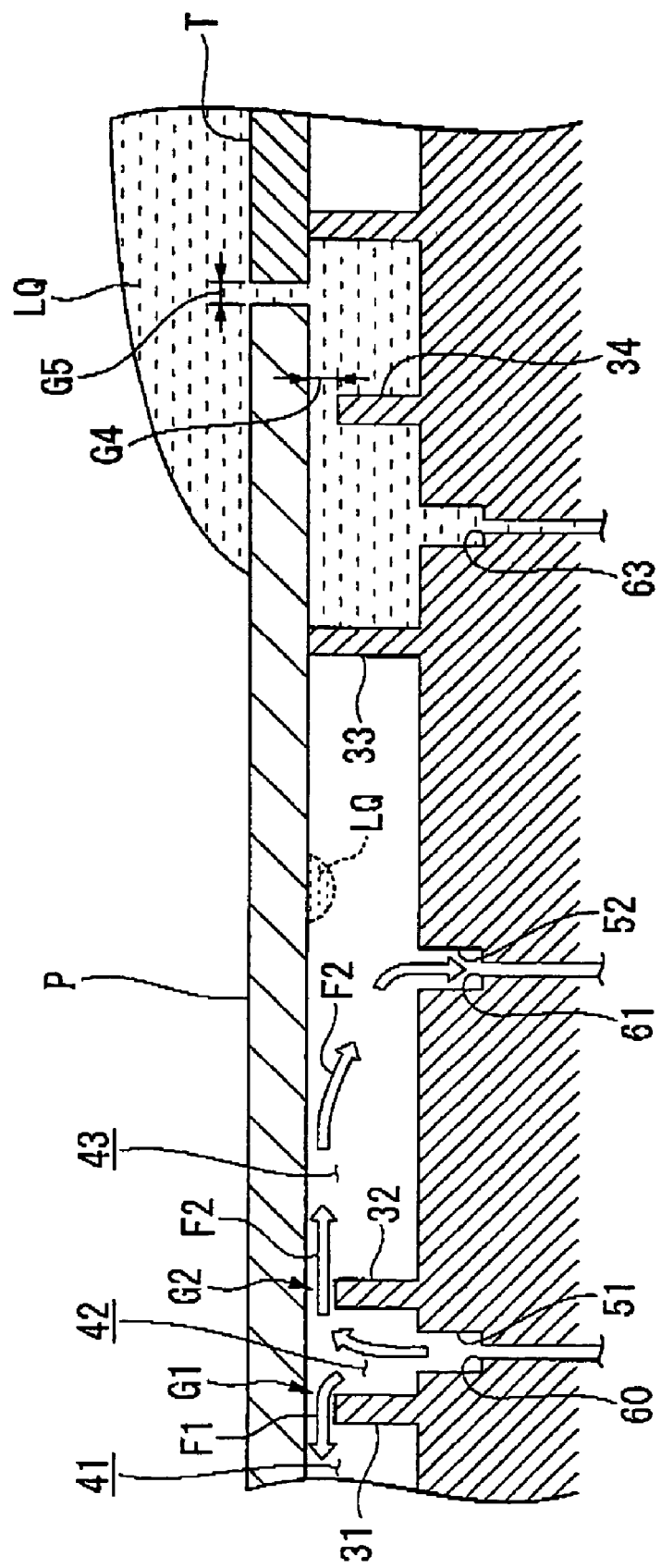
FIG. 8 is a schematic drawing for explaining the operation of the table according to the present embodiment.

FIG. 8 schematically shows the state wherein the suction operation, wherein the first suction ports 61 are used, is performed. As shown in FIG. 8, the suction operation, wherein the first suction ports 61 are used, makes it possible to generate gas flows F2 that flow from the second space 42 toward the third space 43 via the second gap G2. The second space 42 is open to the atmosphere via the fluid flow ports 60; consequently, by performing the suction operation wherein the first suction ports 61 are used, the gas is supplied (flows) from the exterior space (the atmospheric space) into the second space 42 via the fluid flow ports 60; thereby, it is possible to generate the gas flows F2 that flow from the second space 42 toward the first suction ports 61 of the third space 43 via the second gap G2. These gas flows F2 flow from the center of the rear surface of the substrate P toward the outer side thereof consequently, even if the liquid LQ leaks into the space at the inner side of the third circumferential wall 33 from the space between the rear surface of the substrate P and the third upper surface 33A of the third circumferential wall 33, it is possible to prevent the gas flows F2 from a that liquid LQ to leak into the space at the inner side of the second circumferential wall 32, i.e., the first space 41 and the second space 42.

In the present embodiment, the width of the second gap G2 is optimized in order to generate the gas flows F2 in the desired state. In the present embodiment, the second gap G2 is 2-10 μm, which makes it possible to generate the gas flows F2 that flow from the second space 42 toward the third space 43 at a high speed.

Furthermore, as discussed above, the second gap G2 is minute, i.e., approximately 2-10 μm, and the flow volume per unit of time of the gas that flows from the second space 42 into the third space 43 is optimized. Accordingly, the gas that flows from the second space 42 into the third space 43 presents virtually no obstacle to the negative pressurization of the third space 43, thereby making it possible for the first holder HD1 to perform the vacuum chucking operation smoothly. Namely, the second gap G2 is optimized so that it is possible to generate the gas flows F2 in the desired state and to use the first holder HD1 to chuck the substrate P.

In addition, in the present embodiment, the first gap G1 is formed between the rear surface of the substrate P and the first upper surface 31A of the first circumferential wall 31, and thereby it is possible to prevent, for example, local deformation of the substrate P from occurring as a result of; for example, the contact between the first circumferential wall 31 and the substrate P. The first space 41 is negatively pressurized by the suction operation wherein the second suction ports 62 are used, and therefore a gas flow F1 is also generated that flows from the second space 42 toward the first space 41 via the first gap G1; however, the first gap G1 is also optimized so that it is possible to generate the gas flow F1 in the desired state and to use the fit holder HD1 to vacuum chuck the substrate P.

Figure 9:
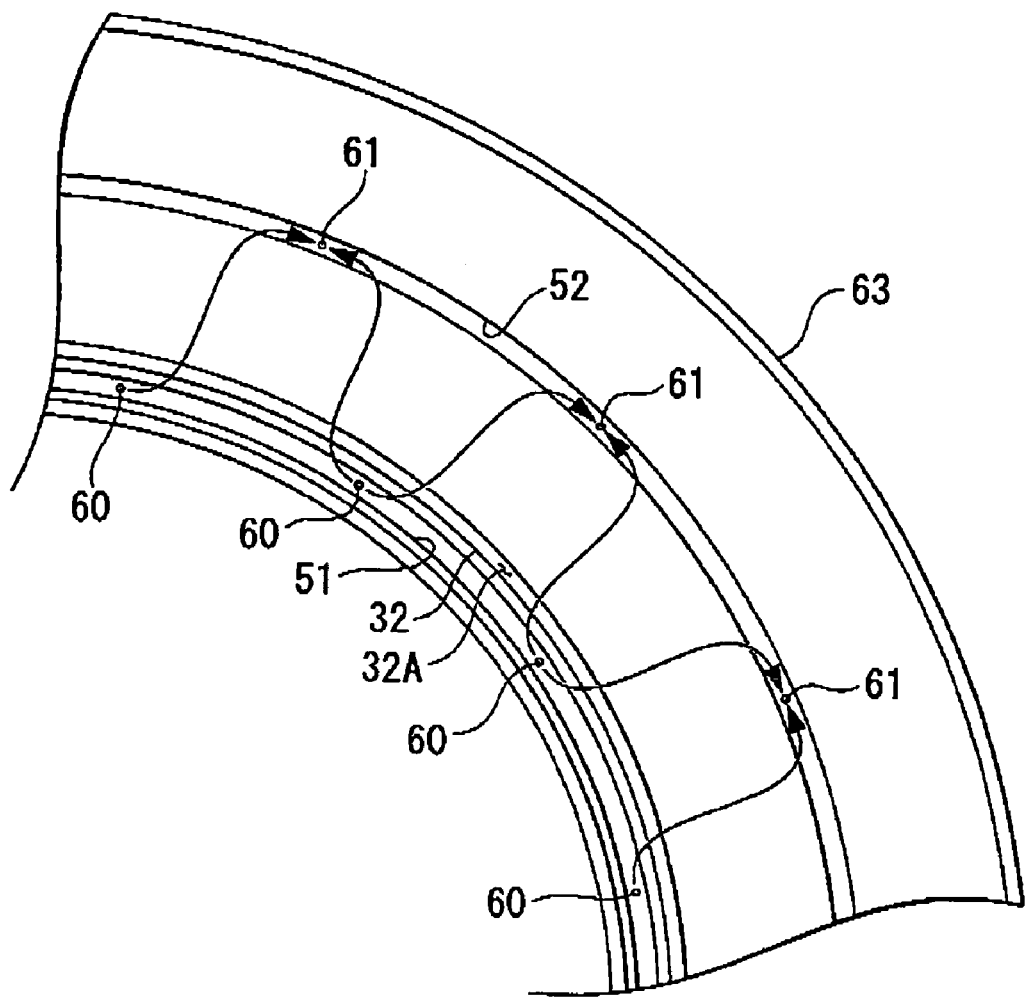
FIG. 9 is a schematic diagram for explaining the flow of a gas.

As shown in the schematic drawing of FIG. 9, the gas that is supplied (that flows) from the fluid flow ports 60 in the second space 42 flows toward the second gap G2 as it is guided to the first groove 51 and spreads in the circumferential directions. Namely, the speed and volume of the flow of the gas that is supplied from the fluid flow ports 60 to the second space 42 toward the second gap G2 are uniformized in the circumferential directions by the first groove 51.

In addition, the second upper surface 32A of the second circumferential wall 32 is annular, and the second gap G2 is substantially the same in the circumferential directions of the second upper surface 32A. Accordingly, the speed and volume of the flow of the gas that flows from the second space 42 to the third space 43 are uniformized over the entire area of the second gap G2.

In addition, as shown it the schematic drawing of FIG. 9, multiple first suction ports 61 are formed at prescribed intervals in the circumferential directions at the outer side of the second circumferential wall 32 so that they surround the second circumferential wall 32. In addition, the first suction ports 61 are formed inside the second groove 52, which is annularly formed so that it surrounds the second circumferential wall 32. The gas that is supplied (that flows) from the second space 42 into the third space 43 flows toward the first suction ports 61 along the second groove 52 as it is guided to the second groove 52 and spreads in the circumferential directions.

Thus, the gas flows F2 that flow from the second space 42 toward the third space 43 via the second gap G2 are uniformized in the circumferential directions. In addition, flows of the gas toward each of the first suction ports 61 are generated along the second groove 52. Accordingly, even if the liquid LQ leaks into the third space 43 at the inner side of the third circumferential wall 33 from any portion between the rear surface of the substrate P, which is supported by the first support members 81, and the third upper surface 33A of the third circumferential wall 33, the liquid LQ that does so is drawn inside the second groove 52 and can be recovered via the first suction ports 61. As a result, it is possible to prevent that liquid LQ from reaching the space (the first space 41 and the second space 42) at the inner side of the second circumferential wall 32.

After the immersion exposure of the substrate P is complete and after the immersion region LR no longer exists on the substrate P and on the plate member T, the control apparatus 7 stops the suction operation of the second suction apparatus 92. After the control apparatus 7 stops the suction operation of the second suction apparatus 92, it continues the suction operation of the first suction apparatus 91 for a prescribed time, and then stops the suction operation of the first suction apparatus 91. Stopping the suction operation of the first suction apparatus 91 after the suction operation of the second suction apparatus 92 is stopped makes it possible to prevent the liquid LQ inside the passageway 61R, which is connected to the first suction apparatus 91, from flowing in reverse and jetting out from the first suction ports 61.

In addition, after the exposure of the substrate P is complete, the control apparatus 7 drives the third suction apparatus 93 in the state wherein the substrate P is held by the first holder HD1 and starts the suction operation, wherein the third suction ports 63 are used, before stopping the suction operation of the second suction apparatus 92. The control apparatus 7 performs the suction operation wherein the third suction ports 63 are used, which makes it possible to recover the liquid LQ that adheres to the overhang area H1 of the rear surface of the substrate P and the liquid LQ that is present in the fourth space 44.

Figure 10:
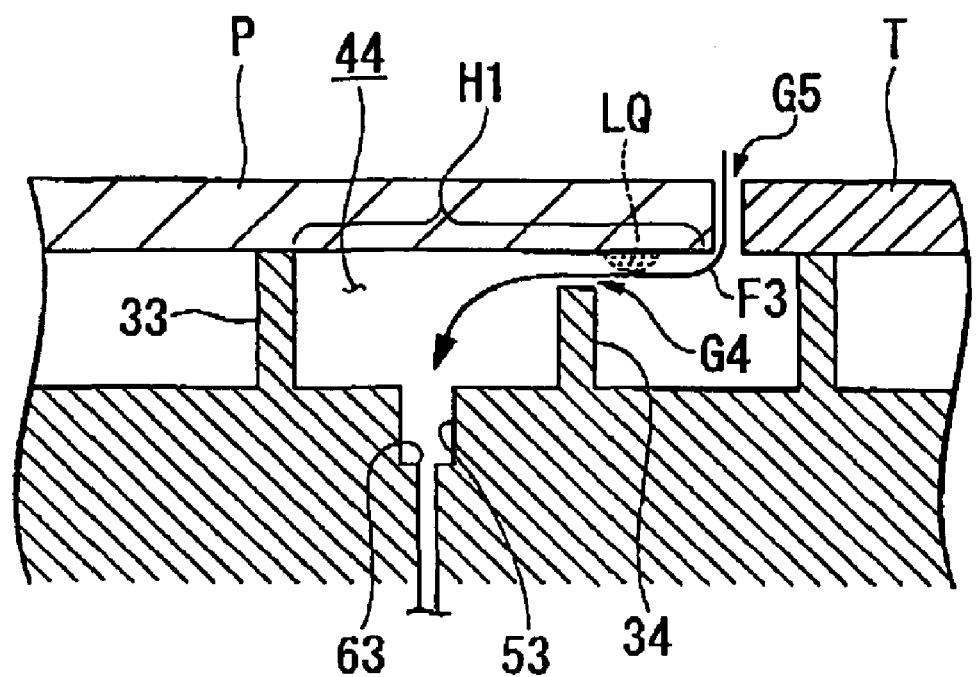
FIG. 10 is a schematic diagram for explaining the flow of the gas.

For example, as shown in FIG. 10, there is a high possibility that the liquid LQ that leaks via the fifth gap G5 will adhere to the overhang area H1 of the rear surface of the substrate P. Alternatively, there is a high possibility that the liquid LQ that leaks into the fourth space 44 via the fifth gap G5 will adhere to, for example, the outer side surface of the third circumferential wall 33, the inner side surface of the fourth circumferential wall 34, and the upper surface of the base material 30. The control apparatus 7 recovers the liquid LQ that leaks into via the fifth gap G5 by driving the third suction apparatus 93 for the prescribed time.

Figure 11:
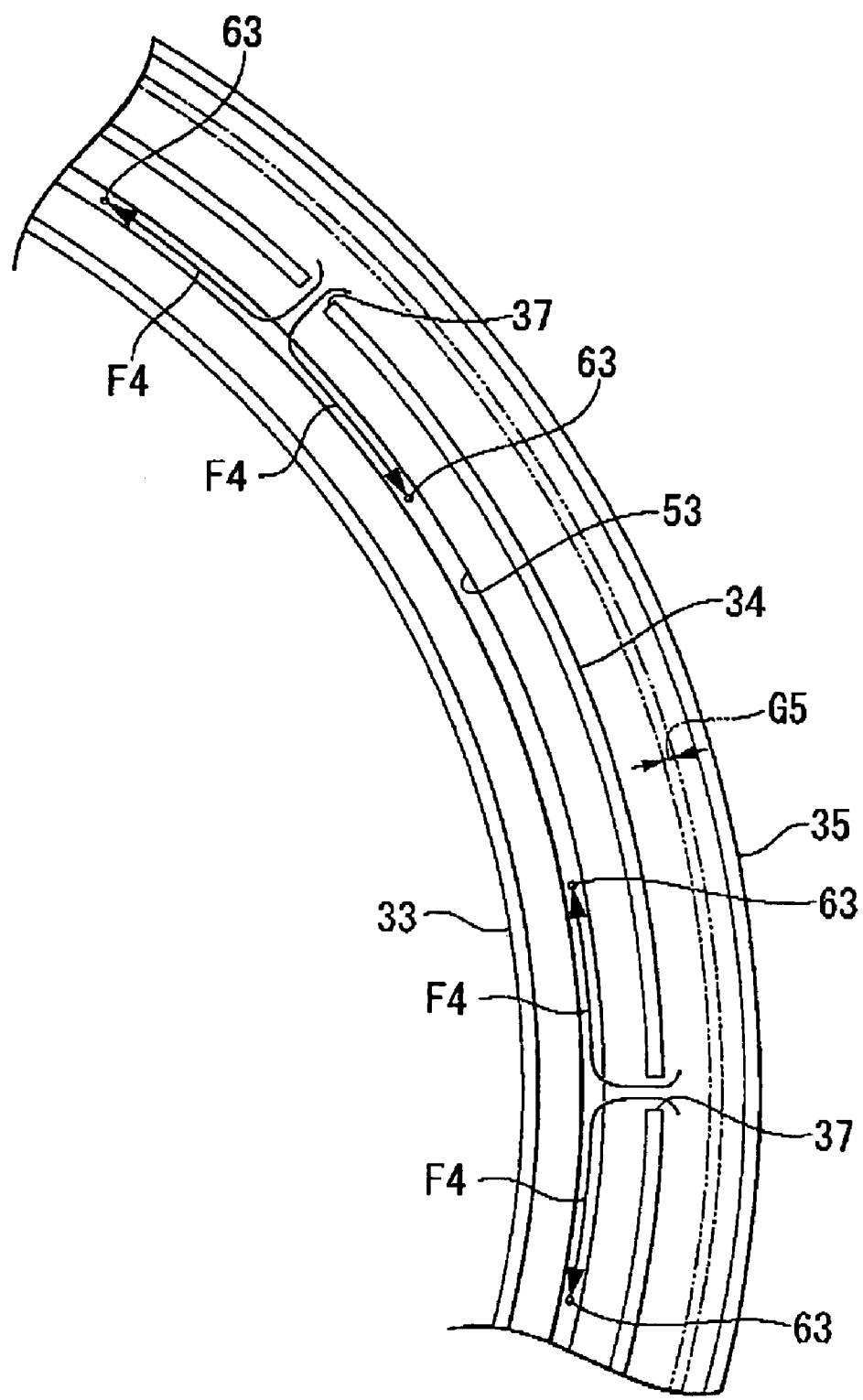
FIG. 11 is a schematic diagram for explaining the flow of the gas.

When the third suction apparatus 93 is driven, the fluid that surrounds the third suction ports 63 (i.e., the fluid in the fourth space 44) is sucked into the third suction ports 63. The fourth gap G4, which is formed between the fourth upper surface 34A of the fourth circumferential wall 34 and the overhang area H1 of the rear surface of the substrate P, forms a passageway through which the gas can circulate between the fourth space 44 and the exterior space. As shown in FIG. 10, the third suction apparatus 93 suctions the fluid (principally gas) from the fourth space 44 via the third suction ports 63, and thereby the fluid flows from the exterior space (the atmospheric space) into the fourth space 44 via the fifth gap G5 and the fourth gap G4, and gas flows F3 are generated that flow toward the third suction ports 63. In addition, the slits 37, which are provided to pats of the fourth circumferential wall 34, also form passageways through which the gas can circulate between the fourth space 44 and the exterior space. As shown in FIG. 11, the third suction apparatus 93 suctions the fluid (principally gas) from the fourth space 44 via the third suction ports 63, and therefore the fluid flows from the exterior space (the atmospheric space) into the fourth space 44 via the fifth gap G5 and the slits 37, and gas flows F4 are generated toward the third suction ports 63.

The gas flows F3, F4, which are generated by the suction operation wherein the third suction ports 63 are used, move the liquid LQ that adheres to the overhang area H1 of the rear surface of the substrate P and the liquid LQ that leaks into the fourth space 44 (the liquid LQ that adheres to, for example, the outer side surface of the third circumferential wall 33, the inner side surface of the fourth circumferential wall 34, and the upper surface of the base material 30) to the third suction ports 63 where it is recovered via the third suction ports 63.

In addition, as shown in the schematic drawing of FIG. 11, multiple third suction ports 63 are formed at prescribed intervals so that they surround the third circumferential wall 33. The third suction ports 63 are formed inside the third groove 53, which is annularly formed, so that they surround the third circumferential wall 33. The gas that is supplied (that flows) from the slits 37 and the fourth gap G4 into the fourth space 44 flows toward the third suction ports 63 while it is being guided to the third groove 53, the outer side surface of the third circumferential wall 33, and the inner side surface of the fourth circumferential wall 34. Accordingly, it is possible to use the third suction ports 63 to recover the liquid LQ that is present in the fourth space 44 smoothly.

As discussed above, in the present embodiment, the suction operation, wherein the third suction ports 63 are used, is performed after the exposure of the substrate P through the liquid LQ is complete. Stopping the suction operation, wherein the third suction ports 63 are used, during the exposure makes it possible to prevent vibrations caused by the suction operation (liquid recovery operation) wherein the third suction ports 63, as well as to prevent a deterioration in the degree of flatness of the front surface of the substrate P. In addition, performing the suction operation, wherein the third suction ports 63 are used, in the state wherein the substrate P is held by the first holder HD1 makes it possible to recover the liquid LQ smoothly. Furthermore, the suction operation (liquid recovery operation), wherein the third suction ports 63 are used, may be performed at any time provided it is after the exposure of the substrate P is complete and before the substrate P is unloaded from the first holder HD1. Furthermore, the suction operation, wherein the third suction ports 63 are used, may be performed during the exposure of the substrate P provided that there is no problem with, for example, vibrations, the flatness of the substrate P, or the heat of vaporization.

In addition, in the present embodiment, the control apparatus 7 stops the suction operation of the second suction apparatus 92 during the suction operation of the third suction apparatus 93. Furthermore, after the operation, wherein the third suction ports 63 are used, of recovering the liquid from the fourth space 44 has continued for the prescribed time, the control apparatus 7 stops the suction operation of the first suction apparatus 91 and thereafter stops the suction operation of the third suction apparatus 93. Thereby, it is possible to reliably prevent the liquid LQ from flowing from the fourth space 44 into the third space 43 at the inner side of the third circumferential wall 33. Furthermore, the suction operations of the first suction apparatus 91 and the third suction apparatus 93 may be stopped simultaneously, or the suction operation of the first suction apparatus 91 may be stopped after the suction operation of the third suction apparatus 93 is stopped, provided that it is after the operation of recovering the liquid LQ from the fourth space 44 has been performed sufficiently.

After all of the suction operations of the first through third suction apparatuses 91, 92, 93 are stopped, the control apparatus 7 uses a substrate lifting mechanism (not shown) to lift the substrate P off of the first: holder HD1 and uses the port apparatus 100 to unload the substrate P from the first holder HD1 at the prescribed substrate exchange position.

Figure 12A:
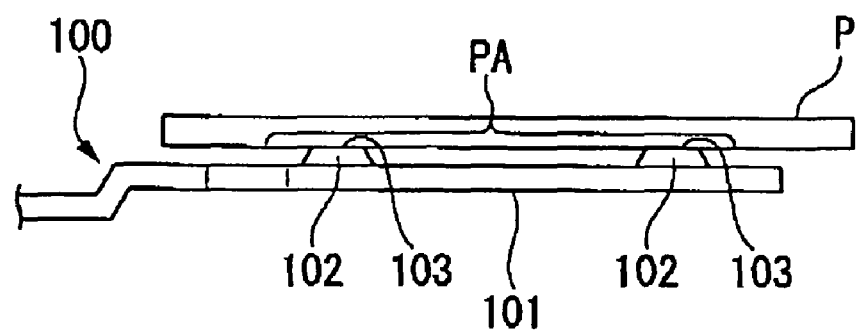
FIG. 12A shows the state wherein a transport apparatus holds a rear surface of the substrate.
Figure 12B:
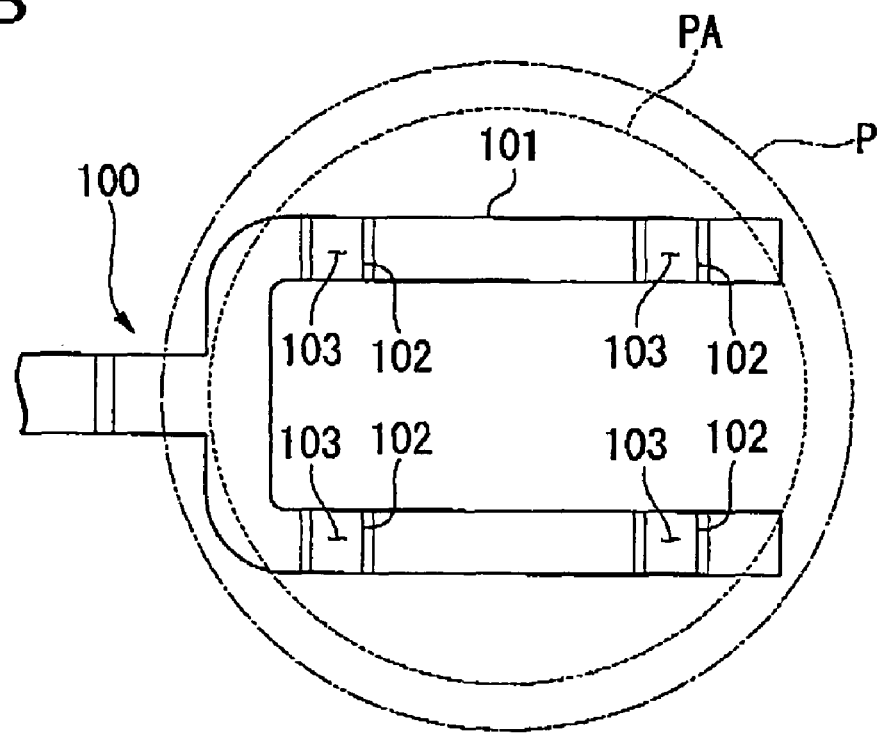
FIG. 12B shows the state wherein the transport apparatus holds the rear surface of the substrate.

FIGS. 12A and 12B show the state wherein the substrate P, which was unloaded from the first holder HD1, is transported by the transported apparatus 100. The transport apparatus 100 comprises an arm member 101 and protruding members 102, each of which is provided on the arm member 101 and has a contact surface 103 that contacts a prescribed area PA in the vicinity of the center of the rear surface of the substrate P. The first space 41 of the first holder HD1 is set in accordance with the prescribed area PA of the rear surface of the substrate P that contacts the contact surfaces 103 of the transport apparatus 100. As discussed above, in the state wherein the rear surface of the substrate P is held by the first holder HD1, the suction operation, wherein the first suction ports 61 are used, prevents the liquid LQ from leaking into the first space 41 and the second space 42, and from adhering to the prescribed area PA on the rear surface of the substrate P. Accordingly, bringing the contact surfaces 103 of the transport apparatus 100 into contact with the prescribed area PA on the rear surface of the substrate P makes it possible to prevent the liquid LQ from adhering to the transport 100.

As explained above, the gas flows F2, which flow from the second space 42 toward the third space 43 via the second gap G2, are generated, and thereby it is possible to prevent the liquid LQ from adhering to the prescribed area PA (the area that corresponds to the first space 41) on the rear surface of the substrate P. Accordingly, it is possible to prevent the liquid LQ from adhering to the transport apparatus 100 even if the transport apparatus 100 contacts the prescribed area PA on the rear surface of the substrate P.

In addition, the liquid LQ that adheres to the overhang area H1 of the substrate P is recovered by the suction operation wherein the third suction ports 63 are used, which makes it possible to prevent the liquid LQ from scattering along the transport pathway even while that substrate P is being transported after it has been unloaded. In addition, providing an eliminating apparatus that is capable of eliminating the liquid LQ that adheres to the substrate P as needed along the path on which the substrate P is transported after it has been unloaded from the substrate stage 4 makes it possible to prevent the liquid LQ from scattering along the transport pathway. In this case, the eliminating apparatus may resupply the liquid LQ onto the substrate P and subsequently eliminate the liquid LQ that adheres to the substrate P.

In addition to the inner side of the first circumferential wall 31, the first support members 81 are disposed between the second circumferential wall 32 and the second groove 52 as well as between the second groove 52 and the third circumferential wall 33, thereby making it possible to support the substrate P satisfactorily while preventing, for example, the substrate P from warping.

In addition, in the present embodiment, the second suction ports 62 are not disposed in the third space 43 between the second circumferential wall 32 and the first suction ports 61 (the first groove 51). Thereby, it is possible to prevent disturbances to and weakening of the gas flows F2 that flow from the second gap G2 toward the first suction ports 61 (the first groove 51) between the second upper surface 32A of the second circumferential wall 32 and the rear surface of the substrate P, which is supported by the first support members 81, and to generate the gas flows F2 in the desired state.

Furthermore, it is preferable to chuck the substrate P on the first holder HD1 successively from the center of the substrate P to its outer side. In this case, the second suction ports 62 that are provided at the inner side of the first circumferential wall 31 and the second suction ports that are provided between the second circumferential wall 32 and the third circumferential wall 33 may be connected to separate suction apparatuses (vacuum pumps and the like), and the suction operation, wherein the second suction ports 62 that are provided between the second circumferential wall 32 and the third circumferential wall 33 are used, may be started after the start of the suction operation wherein the second suction ports 62 that are provided at the inner side of the first circumferential wall 31 are used. Alternatively, one end of the passageway 62R, the other end of which is connected to the second suction ports 62 that are provided between the second circumferential wall 32 and the third circumferential wall 33, may be connected to a connection port that is provided at the inner side of the first circumferential wall 31, and the suction operation, wherein the second suction ports 62 that are provided between the second circumferential wall 32 and the third circumferential wall 33 are used, may be performed via the connection port and the second suction ports 62 that are provided at the inner side of the first circumferential wall 31.

Furthermore, a gas supply apparatus, which comprises a pressure pump and the like, may be connected to the fluid flow ports 60 and may be used to supply gas actively to the second space 42 via the fluid flow ports 60.

Furthermore, the fluid flow ports 60 may be formed at prescribed positions on the upper surface of the base material 30 without forming the first groove 51, provided that an even, desired flow of gas can be generated by optimizing, for example, the arrangement, number, and shapes of the fluid flow ports 60. Similarly, the second groove 52 and the third groove 53 may be omitted and the first suction ports 61 and the third suction ports 63 can be formed at prescribed positions on the upper surface of the base material 30, provided that the desired gas flows can be generated. In addition, the second circumferential wall 32 may be omitted, provided that the gas flows F2 that flow from the fluid flow ports 60 to the first suction ports 61 can be formed with a uniform speed and volume of flow by providing numerous fluid flow ports 60 in the circumferential directions.

Furthermore, in the present embodiment as discussed above, the first gap G1 is formed between the first upper surface 31A of the first circumferential wall 31 and the rear surface of the substrate P, but the first upper surface 31A of the first circumferential wall 31 and the rear surface of the substrate P may contact one another.

Furthermore, at least one annular circumferential wall may be additionally provided at the inner side of the first circumferential wall 31 so that a prescribed gap is formed between that additional wall and the rear surface of the substrate P. The second space 42 is open to the atmosphere, and therefore there is a possibility that the negative pressure (chucking force) in the first space 41 may be insufficient; however, the addition of the at least one annular circumferential wall at the inner side of the first circumferential wall 31 makes it possible to maintain strong chucking force at the space at the inner side of that added circumferential wall. In addition, the chucking force at the space at the inner side of the added circumferential wall is stronger than the chucking force at the space at the outer side thereof, which makes it possible to bold the substrate P stably.

Furthermore, in the present embodiment discussed above, the fluid flow ports (60), which are capable of supplying the gas to the first holder HD1, and the suction ports (61), which recover the liquid LQ that flows thereinto, are provided in order to recover the liquid LQ that flows into the space at the inner side of the third circumferential wall 33; however, fluid flow ports that are capable of supplying the gas to the second holder HD2 and suction ports that recover the liquid LQ that flows thereinto may be provided in order to recover the liquid LQ that leaks into the space at the inner side of the fifth circumferential wall 35 (the fifth space 45 at the rear surface side of the plate member T).

In addition the flat part around the substrate P is formed by the detachable plate member T, but it may be formed by a member that is integral to the base material 30.

In addition, in the projection optical system in the embodiments discussed above, the optical path space at the image plane side of the last optical element is filled with the liquid, but it is possible to adopt a projection optical system wherein the optical path space at the object plane side of the last optical element is also filled with the liquid, as disclosed in PCT International Publication WO2004/019128.

Furthermore, although the liquid LQ in the present embodiment is water, it may be a liquid other than water; for example, if the light source of the exposure light EL is an $F_2$ laser, the light of which does not transmit through water, then it is acceptable to use a fluorine based fluid that is capable of transmitting $F_2$ a light, such as perfluorinated polyether (PFPE) or fluorine based oil, as the liquid LQ. In this case, portions that contact the liquid LQ are lyophilically treated by forming a tins film with, for example, a substance that has a molecular structure that contains fluorine or the like and has low polarity. In addition, it is also possible to use, as the liquid LQ, a liquid (e.g., cedar oil) that is transparent to the exposure light EL, has the highest possible refractive index, and is stable with respect to the projection optical system PL and the photoresist that is coated on the front surface of the substrate P.

In addition, a liquid that has a refractive index of approximately 1.6 to 1.8 may be used as the liquid LQ. Examples of liquids that can be used as the liquid LQ include: a prescribed liquid that has an O—H bond or a C—H bond such as isopropanol, which has a refractive index of approximately 1.50, or glycerol (glycerin), which has a refractive index of approximately 1.61; a prescribed liquid (organic solvent) such as hexane, heptane, or decane; and a prescribed liquid such as decalin or bicyclohexyl. Alternatively, two or more arbitrary types of these prescribed liquids may be mixed together, or an abovementioned prescribed liquid may be added to (mixed with) pure water. Alternatively, the liquid LQ may be a liquid wherein a base, such as $H^+$, $Cs^+$, $K^+$, $Cl^-$, $SO_4^{2-}$, $PO_4^{2-}$, or an acid is added to (mixed with) pure water.

Furthermore, the liquid LQ may be a liquid wherein fine particles of aluminum oxide or the like are added to (mixed with) pure water. These liquids can transmit ArF excimer laser light. In addition, the liquid LQ preferably has a small light absorption coefficient, low temperature dependency, and is stable with respect to the photosensitive material (a protective film such as a topcoat film, an antireflection film, or the like) that is coated on the projection optical system PL and/or the front surface of the substrate P.

The optical element LS1 can be formed from, for example, quart (silica). Alternatively, it may be formed from a monocrystalline fluorine compound material such as calcium fluoride (fluorite), barium fluoride, strontium fluoride, lithium fluoride, sodium fluoride, and $BaLiF_3$. Furthermore, the last optical element FL may be formed from lutetium aluminum garnet (LuAG).

At least one of the optical elements of the projection optical system FL may be formed from a material that has a refractive index that is hiker than that of quartz and/or fluorite (e.g., 1.6 or greater). For example, it is possible to use sapphire, germanium dioxide, or the like as disclosed in PCT International Publication WO2005/059617, or potassium chloride (which has a refractive index of approximately 1.75) or the like as disclosed in PCT International Publication WO2005/059618.

Furthermore, the substrate P in each of the abovementioned embodiments is not limited to a semiconductor wafer for fabricating semiconductor devices; for example, a glass substrate for a display device, a ceramic wafer for a thin film magnetic head, or the original plate of a mask or a reticle (synthetic quartz, silicon wafer) that is used by an exposure apparatus can be employed as the substrate P. The shape of the substrate P is not limited to a circle, and may be another shape, e.g., a rectangle.

The exposure apparatus EX may also be adapted to a step-and-scan type scanning exposure apparatus (a scanning stepper) that scans and exposes the pattern of the mask M while synchronously moving the mask M and the substrate P, as well as to a step-and-repeat type projection exposure apparatus (a stepper) that performs full field exposure of the pattern of the mask M with the mask M and the substrate P in a stationary state, and sequentially steps the substrate P.

In addition, the exposure apparatus EX can also be adapted to an exposure apt that uses a projection optical system (e.g., a dioptric projection optical system that does not include a catoptric element and has a ⅛ reduction magnification) to expose the substrate P with a reduced image of the full field of a first pattern in a state wherein the first patter and the substrate P are substantially stationary. In this case, it can also be adapted to a stitching type full-field exposure apparatus that subsequently further uses that projection optical system to expose the substrate P with a reduced image of the full field of a second pattern, in a state wherein the second pattern and the substrate P are substantially stationary, so that the second pattern partially overlaps the first pattern. In addition, the stitching type exposure apparatus can also be adapted to a step-and-stitch type exposure apparatus that transfers at least two patterns onto the substrate P so that they are partially superposed, and sequentially steps the substrate P.

In addition, the present invention can also be adapted to a multistage type exposure apparatus that is provided with a plurality of substrate stages, as disclosed in for example, Japanese Patent Application Publication No. H10-163099A, Japanese Patent Application Publication No. H10-214783A, Published Japanese Translation No. 2000-505958 of the PCT International Publication, U.S. Pat. Nos. 6,341,007, 6,400, 441, 6,549,269, 6,590,634, 6,208,407, and U.S. Pat. No. 6,262,796.

Furthermore, the present invention can also be adapted to an exposure apparatus that is provided with a substrate stage that holds the substrate and a measurement stage whereon a fiducial member (wherein a fiducial mark is formed) and various photoelectric sensors are mounted, as disclosed in Japanese Patent Application Publication No. H11-135400A, Japanese Patent Application Publication No. 2000-164504A, and U.S. Pat. No. 6,897,963.

In each of the abovementioned embodiments, positional information about the mask stage and the substrate stage are each measured using an interferometer system, but the present invention is not limited thereto and, for example, an encoder system may be used that detects a scale (diffraction grating) that is provided to the upper surface of the substrate stage. In this case, it is preferable to adopt a hybrid system that is provided with both au interferometer system and an encoder system, and to use the measurement results of the interferometer system to calibrate the measurement results of the encoder system. In addition, the position of the substrate stage may be controlled by switching between the interferometer system and the encoder system, or by using both.

Each of the abovementioned embodiments explained an example of an exposure apparatus that comprises a projection optical system that has a plurality of optical elements, but a projection optical system that comprises one optical element may be used. Alternatively, the present invention can be adapted to an exposure apparatus and an exposing method wherein a projection optical system is not used. Even if a projection optical system is not used, exposure light is radiated to the substrate through an optical member, such as a mask or a lens, and an immersion region is formed in a prescribed space between the substrate and such an optical member.

The type of exposure apparatus EX is not limited to a semiconductor device fabrication exposure apparatus that exposes the pattern of a semiconductor device on the substrate P, but can also be widely adapted to exposure apparatuses that are used for fabricating, for example, liquid crystal devices or displays, and exposure apparatuses that are used for fabricating thin film magnetic heads, image capturing devices (CCDs), micromachines (MEMS), DNA chips, or reticles and masks.

Furthermore, in the embodiments discussed above, a light transmitting type mask is used wherein a probed shielding pattern (or a phase pattern or a dimming pattern) is formed on a light transmitting substrate; however, instead of such a mask, it is also possible to use an electronic mask wherein a transmittance pattern, a reflected patter, or a light emitting pattern is formed based on electronic data of the pattern to be exposed, as disclosed in, for example, U.S. Pat. No. 6,778,257; here, an electronic mask, which is also called a viable forming mask includes, for example, a digital micromirror device (DMD), which is one type of a non light emitting image display device (a spatial light modulator).

In addition, by forming interference fringes on the substrate P as disclosed in, for example, PCT International Publication WO2001/035168, the present invention can also be adapted to an exposure apparatus (a lithographic system) that exposes the substrate P with a line-and-space pattern.

Furthermore, the present invention can also be adapted to an exposure apparatus that combines, through a projection optical system, the patterns of two masks on a substrate, and double exposes, substantially simultaneously, a single shot region on that substrate with a single scanning exposure, as disclosed in, for example, Published Japanese Translation No. 2004-519850 of the PCT International Publication (corresponding U.S. Pat. No. 6,611,316).

As far as is permitted, the disclosures in all of the Publications and U.S. patents related to exposure apparatuses and the like cited in the above respective embodiments and modified examples, are incorporated herein by reference.

As described above, the exposure apparatus EX is manufactured by assembling various subsystems, including each constituent element, so that prescribed mechanical, electrical, and optical accuracies as maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus EX from the various subsystems includes, for example, the mechanical interconnection of the various subsystems, the wiring and connection of electrical circuits, and the piping and connection of the atmospheric pressure circuit. Naturally, prior to perform the process of assembling the exposure apparatus EX from these various subsystems, there are also the processes of assembling each individual subsystem. When the process of assembling the exposure apparatus EX from the various subsystems is complete, a comprehensive adjustment is performed to ensure the various accuracies of the exposure apparatus EX as a whole. Furthermore, it is preferable to manufacture the exposure apparatus EC in a clean room wherein, for example, the temperature and the cleanliness level are controlled.

Figure 13:
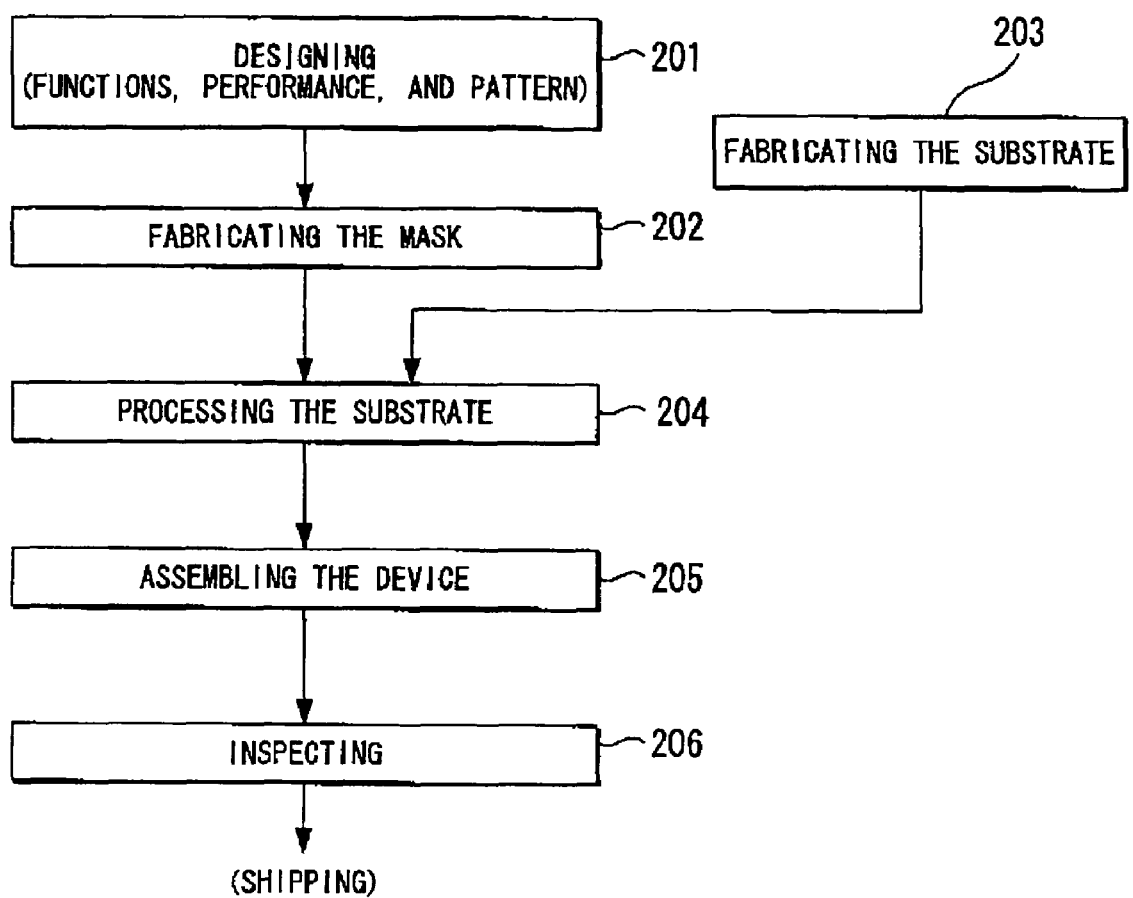
FIG. 13 is a flow chart diagram that depicts one example of a process of fabricating a microdevice.

As shown in FIG. 13, a micro-device, such as a semiconductor device, is manufactured by, for example: a step 201 that designs the functions and performance of the micro-device; a step 202 that fabricates a mask (reticle) based on this designing step; a step 203 that fabricates a substrate, which is the base material of the device; a step 204 that includes substrate treatment processes, such as the process of exposing the pattern of the mask onto the substrate by using the exposure apparatus EX of the embodiments discussed above, a process that develops the exposed substrate, and a process that heats (cures) and etches the developed substrate; a device assembling step 205 (comprising a dicing process, a bonding process, and a packaging process); and an inspecting step 206.

What is claimed is:

1. A substrate holding apparatus that holds a substrate, which is irradiated by exposure light, comprising:
    a base part;
    a support part that is formed on the base part and supports a rear surface of the substrate;
    a first circumferential wall that: is formed on the base part; has a first upper surface that opposes the rear surface of the substrate, which is supported by the support part; and surrounds a first space that is between the substrate, which is supported by the support part, and the base part;
    a second circumferential wall that: is formed on the base part; has a second upper surface that opposes the rear surface of the substrate, which is supported by the support part, with a gap interposed therebetween; and surrounds the first circumferential wall;
    a third circumferential wall that: is formed on the base part; has a third upper surface that opposes the rear surface of the substrate, which is supported by the support part; and surrounds the support part and the second circumferential wall;
    a fluid flow port that is capable of supplying gas to a second space that is between the first circumferential wall and the second circumferential wall; and a first suction port that suctions fluid from a third space that is between the second circumferential wall and the third circumferential wall.

2. A substrate holding apparatus according to claim 1, wherein
a suction operation of the first suction port generates a gas flow that flows from the second space toward the third space via the gap.

3. A substrate holding apparatus according to claim 2, wherein
the gas flow prevents a liquid from leaking into the first space and the second space.

4. A substrate holding apparatus according to claim 1, wherein
the second space is open to the atmosphere via the fluid flow port.

5. A substrate holding apparatus according to claim 1, wherein
the fluid flow port comprises multiple ports that are formed in the base part between the first circumferential wall and the second circumferential wall at prescribed intervals along a circumferential direction of the first circumferential wall.

6. A substrate holding apparatus according to claim 1, further comprising:
a first groove that is formed in the base part between the first circumferential wall and the second circumferential wall so that the first groove surrounds the first circumferential wall;
wherein,
the fluid flow port is formed inside the first groove.

7. A substrate holding apparatus according to claim 1, wherein
the first suction port comprises multiple ports that are formed in the base part between the second circumferential wall and the third circumferential wall at prescribed intervals along the second circumferential wall.

8. A substrate holding apparatus according to claim 1, further comprising:
a second groove that is formed in the base part between the second circumferential wall and the third circumferential wall so that the second groove surrounds the second circumferential wall;
wherein,
the first suction port is formed inside the second groove.

9. A substrate holding apparatus according to claim 8, wherein
the support part comprises a plurality of pin shaped projecting parts, which are disposed in the base part between the second circumferential wall and the second groove and between the second groove and the third circumferential wall.

10. A substrate holding apparatus according to claim 1, wherein
the third circumferential wall is formed so that the rear surface of the substrate, which is supported by the support part, and the third upper surface contact one another.

11. A substrate holding apparatus according to claim 1, further comprising:
a plurality of second suction ports that are provided in the base part at the inner side of the first circumferential wall and between the second circumferential wall and the third circumferential wall, and that suction the fluid from the first space and the third space in order to negatively pressurize the first space and the third space.

12. A substrate holding apparatus according to claim 11, wherein
the negative pressurization of the first space and the third space chucks the rear surface of the substrate to the support part.

13. A substrate holding apparatus according to claim 11, wherein
the second suction port between the second circumferential wall and the third circumferential wall is formed so that the second suction port is further spaced apart from the second circumferential wall than the first suction port is.

14. A substrate holding apparatus according to claim 1, further comprising:
a fourth circumferential wall that: is formed on the base part; has a fourth upper surface that opposes the rear surface of the substrate, which is supported by the support part; and surrounds the third circumferential wall; and
a third suction port that suctions the fluid between the third circumferential wall and the fourth circumferential wall.

15. A substrate holding apparatus according to claim 14, wherein
the third suction port comprises multiple ports that are formed in the base part between the third circumferential wall and the fourth circumferential wall at prescribed intervals along a circumferential direction of the third circumferential wall.

16. A substrate holding apparatus according to claim 14, further comprising:
a third groove that is formed on the base part between the third circumferential wall and the fourth circumferential wall so that the third groove surrounds the third circumferential wall;
wherein,
the third suction port is formed inside the third groove.

17. A substrate holding apparatus according to claim 14, further comprising:
a passageway through which the gas can circulate between a fourth space, which is between the third circumferential wall and the fourth circumferential wall, and an exterior space, which is at the outer side of the fourth circumferential wall with respect to the third circumferential wall.

18. A substrate holding apparatus according to claim 17, wherein
the passageway comprises a slit, which is provided to part of the fourth circumferential wall.

19. A substrate holding apparatus according to claim 17, wherein
the passageway is formed by the fourth upper surface of the fourth circumferential wall.

20. A substrate holding apparatus according to claim 1, wherein
a gap is formed between the rear surface of the substrate, which is held by the support part, and the first upper surface of the first circumferential wall.

21. A substrate holding apparatus according to claim 1, wherein
the first, second, and third circumferential walls each have an annular shape that is substantially similar to the external shape of the substrate.

22. A substrate holding apparatus according to claim 21, wherein
the center of the first space and the center of the substrate substantially coincide.

23. An exposure apparatus, comprising:
a substrate holding apparatus according to claim 1;
wherein, a substrate, which is held by the substrate holding apparatus, is exposed through a liquid.

24. An exposure apparatus according to claim 23, further comprising:
a transport apparatus that is capable of transporting the substrate with respect to the substrate holding apparatus;
wherein,
the first space is set in accordance with an area of the rear surface of the substrate that contacts the transport apparatus.

25. A device fabricating method, comprising:
exposing a substrate using an exposure apparatus according to claim 23; and
developing the exposed substrate.

26. An exposing method that performs an immersion exposure, the method comprising:
holding a substrate with a substrate holding apparatus; and
exposing the substrate, which is held by the substrate holding apparatus;
wherein,
the substrate holding apparatus comprises:
a base part;
a support part that is formed on the base part and supports a rear surface of the substrate;
a first circumferential wall that: is formed on the base part; has a first upper surface that opposes the rear surface of the substrate, which is supported by the support part; and surrounds a first space that is between the substrate, which is supported by the support part, and the base part;
a second circumferential wall that: is formed on the base part; has a second upper surface that opposes the rear surface of the substrate, which is supported by the support part, with a gap interposed therebetween; and surrounds the first circumferential wall;
a third circumferential wall that: is formed on the base part; has a third upper surface that opposes the rear surface of the substrate, which is supported by the support part; and surrounds the support part and the second circumferential wall;
a fluid flow port that is capable of supplying gas to a second space that is between the first circumferential wall and the second circumferential wall; and
a first suction port that suctions fluid from a third space that is between the second circumferential wall and the third circumferential wall.

27. An exposing method according to claim 26, further comprising:
forming an immersion region of a liquid in part of a front surface of the substrate;
wherein,
the substrate is exposed through the liquid.

28. An exposing method according to claim 26, further comprising:
suctioning the fluid from the third space via the first suction port during the exposure of the substrate.

29. An exposing method according to claim 26, wherein
the substrate holding apparatus further comprises a second suction port that is formed on the base part and suctions the gas from the first space in order to chuck the substrate; and
a suction operation wherein the first suction port is used is started after the start of a suction operation wherein the second suction port is used.

30. An exposing method according to claim 29, further comprising:
stopping the suction operation wherein the second suction port is used after the exposure of the substrate is complete; and
stopping the suction operation wherein the first suction port is used after the completion of the suction operation wherein the second suction port is used.

31. The exposing method according to claim 30, wherein
the substrate holding apparatus further comprises a third suction port that is provided on the base part and is provided at the outer side of the third circumferential wall;
the method further comprising:
suctioning the fluid at the outer side of the third circumferential wall using the third suction port after the exposure of the substrate is complete and before the suction operation wherein the second suction port is used is stopped.

32. A device fabricating method, comprising:
exposing the substrate using an exposing method according to claim 26; and
developing the exposed substrate.

* * * * *